(12) United States Patent
Nakamura et al.

(10) Patent No.: US 7,238,462 B2
(45) Date of Patent: Jul. 3, 2007

US007238462B2

(54) UNDERCOATING MATERIAL FOR WIRING, EMBEDDED MATERIAL, AND WIRING FORMATION METHOD

(75) Inventors: Etsuko Nakamura, Kanagawa (JP); Kazumasa Wakiya, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 10/721,164

(22) Filed: Nov. 26, 2003

(65) Prior Publication Data

US 2005/0074695 A1 Apr. 7, 2005

(30) Foreign Application Priority Data

Nov. 27, 2002 (JP) ............................. 2002-343867
Nov. 27, 2002 (JP) ............................. 2002-343868
Nov. 27, 2002 (JP) ............................. 2002-343869
Nov. 27, 2002 (JP) ............................. 2002-343870

(51) Int. Cl.
*G03P 7/004* (2006.01)
(52) U.S. Cl. .............................. 430/273.1; 430/270.1; 430/271.1; 430/281.1; 430/286.1; 430/302; 430/309; 430/434; 430/435; 430/494; 430/944; 430/945
(58) Field of Classification Search ............. 430/271.1, 430/270.1, 272.1, 281.1, 311; 216/41
See application file for complete search history.

(56) References Cited

U.S. PATENT DOCUMENTS 5,310,581 A * 5/1994 Schmidt et al. ............. 427/558

5,981,145 A 11/1999 Ding et al.
5,994,430 A 11/1999 Ding et al.

(Continued)

FOREIGN PATENT DOCUMENTS

JP          01217328 A  *  8/1989

(Continued)

OTHER PUBLICATIONS

English language abstract of JP 1-217328 A.*

(Continued)

*Primary Examiner*—Amanda Walke
(74) *Attorney, Agent, or Firm*—Wenderoth, Lind & Ponack, L.L.P.

(57) ABSTRACT

This invention provides an undercoating layer material and a filler material containing a resin component having at least a substituent group which is capable of releasing a terminal group to form a sulfonic acid residue upon application of predetermined energy, and a solvent. The resin component has at least a repeating unit represented by formula (1):

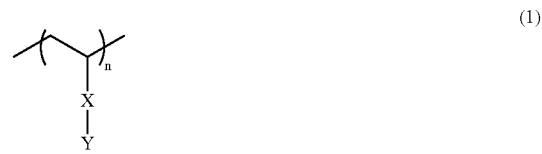

wherein n is an integer of 1 or more, X represents a C1 to C10 linear or branched alkyl chain, an aromatic or alicyclic alkyl chain or an alkyl ester chain, and Y is a substituent group forming a sulfonic acid residue upon application of predetermined energy.

38 Claims, 10 Drawing Sheets

U.S. PATENT DOCUMENTS

| | | | |
|---|---|---|---|
| 6,037,266 A * | 3/2000 | Tao et al. | 438/719 |
| 6,080,678 A * | 6/2000 | Yim | 438/725 |
| 6,127,089 A * | 10/2000 | Subramanian et al. | 430/270.1 |
| 6,232,002 B1 * | 5/2001 | Early et al. | 428/698 |
| 6,329,118 B1 | 12/2001 | Hussein et al. | |
| 6,352,930 B1 * | 3/2002 | Early et al. | 438/694 |
| 6,503,689 B2 * | 1/2003 | Zampini et al. | 430/270.1 |
| 6,569,599 B2 * | 5/2003 | Lee et al. | 430/270.1 |
| 6,764,944 B2 | 7/2004 | Lee et al. | |
| 6,777,161 B2 | 8/2004 | Yasunami et al. | |
| 7,045,276 B2 * | 5/2006 | Takahashi et al. | 430/302 |
| 2002/0139771 A1 | 10/2002 | Jiang et al. | |
| 2002/0142586 A1 | 10/2002 | Shiota | |

FOREIGN PATENT DOCUMENTS

| | | |
|---|---|---|
| JP | 10-092740 | 4/1998 |
| JP | 10282672 A * | 10/1998 |
| JP | 10-319601 | 12/1998 |
| JP | 2000-512336 | 9/2000 |
| JP | 2000-512402 | 9/2000 |
| JP | 2001-183849 | 7/2001 |
| JP | 2002-033257 | 1/2002 |
| JP | 2002-93904 | 3/2002 |
| JP | 2002-299441 | 10/2002 |
| JP | 2002-311594 | 10/2002 |
| JP | 2002-329714 | 11/2002 |

OTHER PUBLICATIONS

English language abstract of JP 10-282672.*

S.J.Whicher, J.L. Brash, J. of Polymer Science, vol. 19, 1995-2006 (1981).*

S.J.Whicher, J.L. Brash, J. of Applied Polymer Science, vol. 30, 2297-2313 (1985).*

* cited by examiner

UNDERCOATING MATERIAL FOR WIRING, EMBEDDED MATERIAL, AND WIRING FORMATION METHOD

CROSS-REFERENCE TO RELATED APPLICATIONS

This application is based upon and claims the benefit of priority from the prior Japanese Patent Applications No. 2002-343867, No. 2002-343868, No. 2002-343869 and No. 2002-343870 filed on Nov. 27, 2002; the entire contents of which are incorporated herein by reference.

BACKGROUND OF THE INVENTION

1) Field of the Invention

The present invention relates to an undercoating material used preferably for forming wiring on a semiconductor substrate, a filler material and a wiring formation method using the same. The undercoating material referred to herein indicates (a) an undercoating layer which is formed on a substrate before formation of a photoresist layer on the substrate whereby a reflected exposure light from the surface of the substrate at the time of patterning of a photoresist is prevented from entering the photoresist, to achieve improvement in the resolution of the photoresist pattern, (b) an undercoating layer suitable for a silicon bilayer resist, which is characterized by improving the patterning accuracy of a resist by constituting a photoresist layer used in lithography for wiring, from two layers, that is, an undercoating layer including an organic film and a silicon-containing upper resist layer, and (c) an undercoating layer suitable for multilayer process, which improves the patterning accuracy of a resist by constituting a photoresist layer used in lithography for wiring, from a multilayer structure including at least an undercoating layer including an organic film, an intermediate layer, and an upper photoresist layer. The filler material referred to herein indicates (d) a material for filling an etching space for forming a dual damascene structure composed at least of a first etching space formed in a low-dielectric layer on a substrate and a second etching space communicating with the first etching space and different in shape and dimension to those of the first etching space.

2) Description of the Related Art

As is well-known, a semiconductor substrate includes a dielectric layer (insulating layer) laminated on a substrate such as silicon wafer, wherein a semiconductor wiring structure is constituted by forming a patterned conductive layer (wiring layer) in the dielectric layer on the semiconductor substrate.

For formation of the wiring structure, two methods are mainly used. The first method involves forming a conductive layer uniformly on the dielectric layer, then forming a photoresist on the conductive layer, irradiating (light-exposing) the photoresist with a pattern light and develop it to form a resist pattern, patterning the conductive layer by etching using the resist pattern as a mask to form a wiring layer, removing the resist pattern and laminating a dielectric layer thereon thereby constituting a wiring layer in the dielectric layer.

The second method involves forming a photoresist pattern on the dielectric layer, then forming a wiring groove (trench) in the dielectric layer by etching using the resist pattern as the mask, removing the resist pattern, embedding a conductive material in the wiring groove and laminating a dielectric layer thereon thereby forming a semiconductor wiring structure.

When the wiring structure is multi-layered, the step of forming a wiring layer in each method is repeatedly carried out to laminate a plurality of wiring layers, and a step of forming a via wire is necessary between the steps of forming wiring layers. The step of forming the via wire is a step which involves forming a via hole in a dielectric layer serving as an interlaminar insulating layer between lower and upper wiring layers, and depositing a conductive material into the via hole by a gaseous phase process or embedding a conductive material therein thereby forming a via wire connecting the lower wiring layer electrically to the upper wiring layer.

In either of the two wiring methods, there arises the phenomenon that upon patterning by exposing the photosensitive layer to light, the exposure light penetrates the resist layer, the penetrating light is reflected by the surface of the undercoating layer, and the reflected light enters a portion which should not be exposed to light. Such an entrance of the reflected light into the photoresist layer results in deterioration of the patterning resolution of the photoresist. In the conventional method, therefore, a resin composition containing a material absorbing exposure light is applied onto a semiconductor substrate to form an undercoating layer before formation of a photoresist layer on the substrate, and then a photoresist layer is formed on the undercoating layer. The undercoating layer is also referred to as an anti reflective coating film from the viewpoint of its action.

As the material of the anti reflective coating film, various materials have been proposed. For example, a resin composition including a polymer having an iminosulfonate group and a solvent is proposed as described in Japanese Patent Application Laid-open No. H10-319601.

As described in Japanese Patent Application Laid-open No. 2000-512336, a light-absorbing polymer including a polymer having a hydroxystyrene unit that has a specific substituent group including a sulfonate is developed, and as described in Japanese Patent Application Laid-Open No. 2000-512402, an anti reflective coating film material including the light absorbing polymer and a solvent is proposed.

In addition to the major property of anti-reflection, the undercoating layer for preventing reflection of exposure light is required to be removable by any method after the etching treatment of the lower conductive layer or the dielectric layer using the photoresist pattern as the mask.

Discussing the conventional undercoating layer from the viewpoint of removal of the undercoating layer after used as an anti reflective coating film, the anti reflective coating film material disclosed in the Japanese Patent Application Laid-open No. H10-319601 uses a polymer having an iminosulfonate group as a resin component, and the resin component is insoluble in a stripping solution for photoresist. In the techniques disclosed in the Japanese Patent Application Laid-open No. H10-319601, therefore, an upper photoresist pattern is removed with the stripping solution, and then the remaining undercoating layer is removed by $O_2$ plasma ashing.

The resin components disclosed in the Japanese Patent Application Laid-open Nos. 2000-512336 and 2000-512402 are also insoluble in the stripping solution for photoresist so that after a photoresist pattern is removed with the stripping solution, the remaining undercoating layer is removed by $O_2$ plasma ashing.

As is well known, in the semiconductor wiring structure, a dielectric layer with which wiring layers are covered and thereby electrically separated from other wiring layers is required to have a dielectric constant as low as possible so as not to influence the electric characteristics of the wiring layers. Specifically, the dielectric constant (k) of the dielectric material is as low as 3.0 or less in majority of cases. However, a material having such low dielectric constant is poor in resistance to $O_2$ plasma ashing so that by exposure to $O_2$ plasma, its surface is easily deteriorated, or the dielectric constant is increased.

When the conventional anti reflective coating film is formed on a semiconductor substrate having the dielectric layer of such low dielectric constant, $O_2$ plasma ashing for removing the anti reflective coating layer may cause deterioration such as corrosion of the dielectric layer or rise in the electric constant, and as a result, there arises a problem that the electric characteristics of the wiring layer are adversely affected.

In production of the semiconductor wiring structure, the patterning of the photoresist and the undercoating layer by lithography is carried out for forming the wiring layer on the semiconductor by etching or for forming the wiring groove for embedding the wiring layer, as described above. The regulatory factor in the lithographic step includes many factors such as regulation of current intensity and voltage in a stepper for generating exposure light, adjustment of a focal point of a lens, accuracy of a photomask, accuracy of an attachment position, and coating properties and curing characteristics of a photoresist composition. When these regulatory factors vary for some reason, there occurs patterning insufficiency, due to which the lithographic step has to be conducted again. In this case, disposal of the semiconductor substrate and use of a new semiconductor substrate lead to waste of resources and exert an adverse effect on the environment. In the production process, it is thus required to recover the semiconductor substrate by removing the photoresist layer and undercoating layer that have been subjected to insufficient lithography. Removal of the undercoating layer in a recovering step for re-generating the semiconductor substrate is referred to as rework treatment, which is an important process in terms of economical efficiency in the production of the semiconductor wiring structure. Discussing the conventional anti reflective coating film from the viewpoint of such rework treatment, the conventional anti reflective coating layer is not suitable because there is a problem that it should be removed by $O_2$ plasma ashing easily causing deterioration in the characteristics of a semiconductor substrate after rework treatment.

On the other hand, high integration is an everlasting task for a device having the wiring structure described above, and there is demand for finer wiring. For achieving finer wiring, it is necessary to improve the patterning resolution of the photoresist for lithography and to improve the patterning resolution of the wiring layer or the wiring groove formed by etching using a resist-pattern as the mask that has been obtained by exposure. As the thickness of the resist layer becomes thinner, the accuracy of pattern transfer to the resist using the exposure device and the wiring pattern mask can be improved. On the other hand, such a thin resist layer results in difficulty in maintaining the resistance of the resist layer in the step of etching the undercoating layer using the resist pattern as the mask, and disadvantageous effect in the etching resolution of the wiring layer or the wiring groove. To improve resist resistance, thicker layer is preferable. Therefore, there is an antinomic requirement in the determination of the photoresist thickness for improving the accuracy of lithography with a photoresist. As a technique for solving the problem to improve the accuracy of lithography with the photoresist, there is provided a wire formation method using a silicon bilayer resist and a wire formation method using a multilayer resist (Japanese Patent Application Laid-open No. H10-92740).

The former wire formation method is a lithographic technique for improving pattern transfer accuracy in spite of a thick resist layer by forming a resist not into a monolayer structure but into a two-layer structure. In this technique, a thick undercoating layer consisting of an organic polymer material is formed on a substrate, and an upper thin resist layer consisting of a silicon-containing photoresist material highly resistant to oxygen plasma etching is formed thereon. Thereafter, a wiring pattern is transferred to the upper resist layer to form an upper resist pattern. The undercoating layer is then patterned by oxygen plasma etching using the resulting upper resist pattern as a mask. The resist layer thus obtained is a layer that is thick as a whole with high pattern transfer accuracy.

Materials for constituting the silicon bilayer resist are, for example, disclosed in Japanese Patent Application Laid-open No. 2002-033257. In this application, the undercoating layer is referred to as a first resist layer, and the upper resist layer is called a second resist layer.

It is described therein that, as a general material constituting the first resist layer, a condensed polymer compound such as novolak resin, phenol resin and cresol resin and a vinyl polymer having an aromatic ring such as a phenyl group or a condensed aromatic ring such as naphthyl group or anthryl group in its side chain is used, and that various kinds of known photoresists can also be preferably used.

It is described therein that, as the silicon-containing photosensitive composition used in the second resist layer, a known one can be used.

In the silicon bilayer resist process, it is necessary to remove the resist by any method after finishing etching of the deeper conductive layer or dielectric layer using the resist pattern as the mask. In Japanese Patent Application Laid-open No. 2002-033257, a silicon-containing upper resist layer is removed by wet stripping treatment unique to this patent application, and the remaining undercoating layer is removed by $O_2$ plasma ashing.

It is well-known that in the semiconductor wiring structure, a dielectric layer with which wiring layers are covered and thereby electrically separated from other wiring layers is required to have a dielectric constant as low as possible so as not to influence the electric characteristics of the wiring layers. Specifically, the dielectric constant (k) of the dielectric material is as low as 3.0 or less in majority of cases. However, a material having such low dielectric constant is poor in resistance to $O_2$ plasma ashing so that by exposure to $O_2$ plasma, its surface is easily deteriorated, or the dielectric constant is increased.

When a resist pattern made of the conventional silicon bilayer resist is formed on a semiconductor substrate having the dielectric layer of such low dielectric constant to form a wiring layer, $O_2$ plasma ashing for removing the undercoating layer on the substrate may cause deterioration such as corrosion of the dielectric layer or rise in the electric constant, and as a result, there arises a problem that the electric characteristics of the wiring layer are adversely affected.

In production of the semiconductor wiring structure, the patterning of the photoresist and the undercoating layer by lithography is carried out for forming the wiring layer on the semiconductor by etching or for forming the wiring groove for embedding the wiring layer, as described above. The regulatory factor in the lithographic step includes many factors such as regulation of current intensity and voltage in a stepper for generating exposure light, adjustment of a focal point of a lens, accuracy of a photomask, accuracy of an attachment position, and coating properties and curing characteristics of a photoresist composition. When these regulatory factors vary for some reason, there occurs patterning insufficiency, due to which the lithographic step has to be conducted again. In this case, disposal of the semiconductor substrate and use of a new semiconductor substrate lead to waste of resources and exert an adverse effect on the environment. In this production process, it is thus required to recover the semiconductor substrate by removing the photoresist layer and undercoating layer that have been subjected to insufficient lithography. Removal of the undercoating layer in the recovering step for re-generating the semiconductor substrate is referred to as rework treatment, which is an important process in terms of economical efficiency in the production of the semiconductor wiring structure. Discussing the conventional undercoating layer from the viewpoint of such rework treatment, the conventional undercoating layer is not suitable because there is a problem that it should be removed by $O_2$ plasma ashing easily causing deterioration in the characteristics of a semiconductor substrate after rework treatment.

As the technique of making a photoresist layer into a substantially two-layer structure, a technique of arranging, below the resist layer, an undercoating layer for the purpose of preventing exposure light from being reflected is known besides the technique of using the silicon bilayer resist. The undercoating layer is composed of a resin composition having a high ability to absorb the exposure light, and plays a role in preventing reflection of exposure light by absorbing patterning light for the upper resist thereby preventing the light from reaching the surface of the substrate. It may be considered that the material for forming the undercoating layer can also be used to form an undercoating layer in the silicon bilayer resist. If the anti reflective coating film can be removed without using $O_2$ plasma ashing, the problem in the wiring formation method using the silicon bilayer resist can be solved.

As a material for the ant reflective coating film, various compositions have been proposed. For example, a resin composition containing a polymer having an iminosulfonate group and a solvent is proposed (Japanese Patent Application Laid-open No. H10-319601).

A light-absorbing polymer containing a polymer having a hydroxystyrene unit that has a specific substituent group containing a sulfonate has been developed, (Japanese Patent Application Laid-open No. 2000-512336) and a anti reflective coating film material including the light absorbing polymer and a solvent has been proposed (Japanese Patent Application Laid-open No. 2000-512402).

The anti reflective coating film material disclosed in the Japanese Patent Application Laid-open No. H10-319601 uses a polymer having an iminosulfonate group as a resin component, and the resin component is insoluble in a stripping solution for photoresist. In the techniques disclosed in the Japanese Patent Application Laid-open No. H10-319601, therefore, the upper photoresist pattern is removed with the stripping solution, and then the remaining undercoating layer is removed by $O_2$ plasma ashing.

The resin components disclosed in the Japanese Patent Application Laid-open Nos. 2000-512336 and 2000-512402 are also insoluble in the stripping solution for photoresist, and after the photoresist pattern is removed with the stripping solution, the remaining undercoating layer is removed by $O_2$ plasma ashing.

Accordingly, even if the conventional anti reflective coating film is employed as the undercoating layer in the silicon bilayer resist, the problem attributable to removal of the undercoating layer cannot be solved.

The latter of the aforementioned wiring formation methods (Japanese Patent Application Laid-open No. H10-92740) or the multilayer process is the technique of forming the resist not into the single layer but into the multilayer structure, whereby (1) the uppermost photoresist layer to which the pattern is first transferred through the mask is made thin to improve both resolution and focal depth in lithography and (2) the anti reflective coating film etc. having less film interfering effect and high resistance to etching is formed as a multilayer below the uppermost layer, to give a resist pattern excellent in dry etching resistance with high pattern transfer accuracy. In this technique, a composite anti reflective coating film is first formed on a substrate. This composite anti reflective coating film is a multilayer composed for example of a carbon film and a silicon oxide film and if necessary a silicon nitride barrier layer therebetween. An upper thin photoresist layer is formed on the multilayer. Thereafter, a wiring pattern is transferred by lithography to the upper photoresist layer, to form an upper resist pattern. The silicon oxide film as an intermediate layer is then subjected to etching with the resulting upper resist pattern as the mask to transfer the pattern. Subsequently, the carbon film as an undercoating layer is subjected to etching using the upper resist pattern and the intermediate layer pattern as the mask, to transfer the wiring pattern. Finally, the upper resist pattern and the intermediate layer pattern are removed, whereby a carbon film (undercoating layer) pattern excellent in dry etching resistance with high pattern transfer accuracy is obtained. The substrate is etched according to the pattern with the undercoating layer pattern as the mask.

In the multilayer resist, it is necessary to remove the finally remaining undercoating layer (carbon film) pattern by any method after finishing patterning by etching processing of the lower conductive layer or dielectric layer. In Japanese Patent Application Laid-open No. H10-92740, the pattern is removed by $O_2$ plasma ashing.

It is well-known that in the semiconductor wiring structure, a dielectric layer with which wiring layers are covered and thereby electrically separated from other wiring layers is required to have a dielectric constant as low as possible so as not to influence the electric characteristics of the wiring layers. Specifically, the dielectric constant (k) of the dielectric material is required to be as low as 3.0 or less. However, a material having such low dielectric constant is poor in resistance to $O_2$ plasma ashing so that by exposure to $O_2$ plasma, its surface is easily deteriorated, or the dielectric constant is increased.

When a resist pattern made of the conventional multilayer resist is formed on a semiconductor substrate having the dielectric layer of such low dielectric constant to form a wiring layer, $O_2$ plasma ashing for removing the undercoating layer on the substrate may cause deterioration such as corrosion of the dielectric layer or rise in the electric constant, and as a result, there arises a problem that the electric characteristics of the wiring layer are adversely affected.

In production of the semiconductor wiring structure, the patterning of the photoresist and the undercoating layer by lithography is carried out for forming the wiring layer on the semiconductor by etching or for forming the wiring groove for embedding the wiring layer, as described above. The regulatory factor in the lithographic step includes many factors such as regulation of current intensity and voltage in a stepper for generating exposure light, adjustment of a focal point of a lens, accuracy of a photomask, accuracy of an attachment position, and coating properties and curing characteristics of a photoresist composition. When these regulatory factors are varied for some reason, there occurs patterning insufficiency, due to which the lithographic step has to be conducted again. In this case, disposal of the semiconductor substrate and use of a new semiconductor substrate lead to waste of resources, and exert an adverse effect on the environment. When insufficiency in lithography is found out in such a production process, it is therefore necessary to recover the semiconductor substrate by removing the resist remaining on the substrate. Removal of the defective resist in the recovering step for re-generating the semiconductor substrate is referred to as rework treatment, which is an important process in terms of economical efficiency in the production of the semiconductor wiring structure. Discussing the conventional undercoating layer from the viewpoint of such rework treatment, the conventional undercoating layer is not suitable because there is a problem that it should be removed by $O_2$ plasma ashing easily causing deterioration in the characteristics of a semiconductor substrate after rework treatment.

A phenomenon called poisoning that often occurs upon use of a low-dielectric layer as an interlaminar insulating layer for supporting the wiring layer is recently problematic in the step of forming a resist pattern, and there is a need for solving it.

The poisoning phenomenon occurs easily upon use of the low-dielectric layer as the interlaminar insulating layer, and cannot be prevented by the conventional undercoating material. Accordingly, there is demand at present for development of an undercoating material capable of maintaining easiness of removal after use and of preventing the poisoning phenomenon in the wiring structure forming process using the low-dielectric layer.

As the technique of making a photoresist layer into a substantially multilayer (two-layer) structure, a technique of arranging, below the resist layer, an undercoating layer for the purpose of preventing exposure light from being reflected is known besides the technique of using the multilayer resist. The undercoating layer is composed of a resin composition having a high ability to absorb the exposure light, and plays a role in preventing reflection of exposure light by absorbing patterning light for the upper resist thereby preventing the light from reaching the surface of the substrate. If the anti reflective coating film can be removed without using $O_2$ plasma ashing, and can prevent the adverse influence of poisoning on the resist layer, the problem in the wiring formation method using the multilayer resist can be solved.

As a material for the anti reflective coating film, various materials have been proposed. For example, a resin composition containing a polymer having an iminosulfonate group and a solvent is proposed. (Japanese Patent Application Laid-open No. H10-319601)

A light-absorbing polymer containing a polymer having a hydroxystyrene unit that has a specific substituent group containing a sulfonate has been developed, (Japanese Patent Application Laid-open No. H2000-512336) and an anti reflective coating film material including the light absorbing polymer and a solvent has been proposed. (Japanese Patent Application Laid-open No. H2000-512402)

The anti reflective coating film material disclosed in the Japanese Patent Application Laid-open No. H10-319601 uses a polymer having an iminosulfonate group as a resin component, and the resin component is insoluble in a stripping solution for photoresist. In the techniques disclosed in the Japanese Patent Application Laid-open No. H10-319601, therefore, the upper photoresist pattern is removed with the stripping solution, and then the remaining undercoating layer is removed by $O_2$ plasma ashing.

The resin components disclosed in the Japanese Patent Application Laid-open Nos. 2000-512336 and 2000-512402 are also insoluble in the stripping solution for photoresist so that after the photoresist pattern is removed with the stripping solution, the remaining undercoating layer is removed by $O_2$ plasma ashing.

Accordingly, even if the conventional anti-reflective coating film is employed as the undercoating layer in the multilayer resist, the problem attributable to removal of the undercoating layer cannot be solved.

In light of a fundamental wiring structure in a semiconductor integrated circuit, it is well-known that the fundamental wiring structure is a structure wherein a lower wiring layer formed directly or indirectly on a semiconductor substrate and an upper wiring layer formed via an interlaminar insulating layer on the lower wiring layer are connected through a via wire formed so as to penetrate the interlaminar insulating layer. By combining a plurality of such wiring structures, the multilayer wiring structure of a semiconductor integrated circuit is formed.

As a method of realizing the multilayer wiring structure by using copper excellent in electro-migration resistance, a dual damascene process is known. In the dual damascene process, a dual damascene structure composed at least of a first etching space formed in a low-dielectric layer on a substrate and a second etching space communicating with the first etching space and different in shape and dimension to those of the first etching space is formed. The above-described wiring structure is realized by embedding a conductive material in the dual damascene structure.

The fundamental dual damascene process is described in more detail by reference to FIGS. 1A to 1D and FIGS. 2E to 2H.

As illustrated in FIG. 1A, an interlaminar insulating layer 2 is formed on substrate 1. $SiO_2$, carbon doped oxide (SiON), spin-on-glass (hereinafter, "SOG") or the like are used as a material for forming the interlaminar insulating layer 2. A resist layer 3 is formed and patterned on the interlaminar insulating layer 2. The interlaminar insulating layer 2 is etched selectively with the patterned resist layer 3 as the mask, and then the resist layer 3 is removed, whereby a wiring groove (trench) 4 is formed as illustrated in FIG. 1B. A barrier metal 5 is then deposited on the surface of the interlaminar insulating layer 2 having the wiring groove 4 formed therein as described above, whereby the adhesion between copper to be embedded in the wiring groove 4 and the interlaminar insulating layer 2 is improved while a barrier metal film for preventing diffusion of copper into the interlaminar insulating layer 2 is formed on the wiring groove 4. As illustrated in FIG. 1C, copper is then embedded in the wiring groove 4 by electrolytic plating etc., to form a lower wiring layer 6.

Copper adhering to the surface of the interlaminar insulating layer 2, and the remaining barrier metal 5, are then removed by chemical polishing (hereinafter, "CMP"), to flatten the surface of the interlaminar insulating layer 2, and then a first low-dielectric layer 7, a first etching stopper film 8, a second low-dielectric layer 9 and a second etching stopper film 10 are laminated thereon in this order. A resist mask 11 having a pattern for forming a via hole is then formed on the second etching stopper film 10. As illustrated in FIG. 1D, the resist mask 11 is used in etching, whereby a via hole 12 penetrating the second etching stopper film 10, the second low-dielectric body 9, the first etching stopper layer 8 and the first low-dielectric layer 7 and reaching the surface of the lower wiring layer 6 is formed. As illustrated in FIG. 2E, embedded material 13 such as a photoresist material is then charged into the via hole 12. The embedded material 13 is etched back so that as illustrated in FIG. 2F, the material 13 having a desired thickness was left in the bottom of the via hole 12, and a resist mask 14 having a trench-forming pattern is formed on the second etching stopper film 10. As illustrated in 2G, the second etching stopper film 10 and the second low-dielectric layer 9 are etched using the resist mask 14, whereby a trench 15 is formed and simultaneously the embedded material 13 remaining at the bottom of the via hole 12 is removed. Thereafter, copper is embedded in the via hole 12 and the trench 15, to form a via wire 16 and upper wiring layer 17, as illustrated in FIG. 2H. A multilayer wiring structure having the lower layer wiring layer 6 connected electrically through the via wire 16 to the upper wiring layer 17 is thus realized.

In the multilayer wiring structure obtained by the process, the trench corresponds to the first etching space or the second etching space, and the via hole corresponds to the second etching space or the first etching space. In the process illustrated in FIG. 1, therefore, the dual damascene structure is constituted by the trench 15 and the via hole 12 connected to the bottom of the trench 15.

In the method of forming the dual damascene structure, an embedded material is used. The role of the embedded material is as follows. That is, upon etching for forming the trench after forming the via hole, existence of a exposed portion of the substrate at the bottom of the via hole may cause damage on the lower wiring layer on the substrate by the etching gas for forming the trench, which may result in defects in wiring. The embedded material is thus charged into the via hole to protect the lower wiring layer in the trench formation step.

As the embedded material, a photoresist composition is conventionally used. However, when such a photoresist composition is charged into the via hole, the composition may form bubbles to cause defect in embedding. It is therefore proposed to use, as a new filler material, a solution having a heat-crosslinking compound dissolved in an organic solvent. (Japanese Patent Application Laid-open No. 2002-033257)

In the constitution using the organic film as an filler material, there is however a problem that removal of the embedded material remaining in the via hole is not easy after use, thus requiring its removal by oxygen plasma ashing. In this case, the low-dielectric layer may be damaged by an ashing gas (mainly an oxygen-based gas). The damage includes a change of Si—R bond into Si—OH bond or an increase in dielectric constant (k) in the low-dielectric layer.

A photoresist is used in forming a wiring layer, and exposed to light in patterning, but there is a known problem that the exposure light is reflected by the surface of the undercoating layer, and the reflected light enters a non-light-exposed region, to reduce the patterning resolution of the resist. A technique of arranging, below the resist layer, an undercoating layer for the purpose of preventing exposure light from being reflected is known, and the undercoating layer is composed of a resin composition having a high ability to absorb the exposure light, and plays a role in preventing reflection of exposure light by absorbing patterning light for the upper resist thereby preventing the light from reaching the surface of the undercoating layer. It may be considered that the material for forming the lower anti reflective coating film can also be used as a n embedded material for forming the dual damascene structure. If the anti reflective coating film can be removed without using $O_2$ plasma ashing, the problem in the dual damascene structure formation method can be solved.

As a material for the anti reflective coating film, various materials have been proposed. For example, a resin composition containing a polymer having an iminosulfonate group and a solvent is proposed. (Japanese Patent Application Laid-open No. H10-319601)

A light-absorbing polymer containing a polymer having a hydroxystyrene unit that has a specific substituent group containing a sulfonate has been developed, (Japanese Patent Application Laid-open No. 2000-512336) and an anti reflective coating film material including the light absorbing polymer and a solvent has been proposed. (Japanese Patent Application Laid-open No. 2000-512402)

The anti reflective coating film material disclosed in the Japanese Patent Application Laid-open No. H10-319601 uses a polymer having an iminosulfonate group as a resin component, and the resin component is insoluble in a stripping solution for photoresist. In the techniques disclosed in the Japanese Patent Application Laid-open No. H10-319601, therefore, the upper photoresist pattern is removed with the stripping solution, and then the remaining undercoating layer is removed by $O_2$ plasma ashing.

The resin components disclosed in the Japanese Patent Application Laid-open Nos. 2000-512336 and 2000-512402 are also insoluble in the stripping solution for photoresist so that after the photoresist pattern is removed with the stripping solution, the remaining undercoating layer is removed by $O_2$ plasma ashing.

Accordingly, even if the conventional anti reflective coating film is employed as the embedded material for forming a dual damascene structure, the problem attributable to removal of the embedded material cannot be solved.

On the other hand, use of a spin-on-glass material as the filler material for forming a dual damascene structure is conceivable. Use of the spin-on-glass material as the filler material is disclosed in for example U.S. Pat. No. 6,329,118. The spin-on-glass material can be removed with a stripping solution, and thus the remaining embedded material can be removed without using $O_2$ plasma ashing, and the problem of deterioration in the low-dielectric layer can be eliminated.

However, a phenomenon called poisoning that often occurs upon use of the low dielectric layer as the interlaminar insulating layer for supporting the wiring layer is recently problematic in the step of forming the dual damascene structure, and this problem also occurs even upon use of the spin-on-glass material as the filler material or the filler material removable by $O_2$ plasma ashing, and there is a need for solving it.

The above-described poisoning causes a significant defect in the shape of the second etching space 15 obtained in the wiring formation process illustrated in FIG. 2G. FIG. 3 is a schematic view showing a normal etching space and an etching space having defect in shape. FIG. 3A is an enlarged plan view of an essential part where the trench (second etching space) 15 can be formed normally without the poisoning phenomenon, and 3B is an enlarged plan view of an essential part where the poisoning phenomenon occurred to cause defects in the shape of the trench (second etching space) 15. In FIG. 3, the same element as in FIGS. 1 and 2 is given the same symbol to simplify the description. FIG. 3B is illustrated with relatively higher magnification than FIG. 3A. As illustrated in the figures, the embedded material and the photoresist layer are deteriorated by the poisoning phenomenon due to a basic substance generated from the low-dielectric layer 9, and the resist pattern is formed such that the via hole (first etching space) 12 is covered therewith, and the shape of the trench 15 is significantly deformed.

The above-described poisoning phenomenon occurs easily upon use of the low dielectric layer as the interlaminar insulating layer, and cannot be prevented by the conventional filler material for forming the dual damascene structure. Accordingly, there is demand at present for development of the filler material capable of preventing the poisoning phenomenon while maintaining a property of entering into the etching space and easiness of removal after use in the process for forming a dual damascene structure using a low-dielectric layer.

SUMMARY OF THE INVENTION

The present invention has been achieved in order to solve the above problems. A first object of the present invention is to provide an undercoating material which highly absorbs exposure light and exhibits an excellent resistance to a 2.38 wt % tetrametyl ammonium hydroxide (hereinafter, "TMAH") developing solution used usually in a photoresist development step, and which is removable after use with a photoresist stripping solution to enable a facile rework treatment of a substrate.

A second object of the present invention is to provide an undercoating material for a silicon bilayer resist which exhibits an excellent resistance to a photoresist developing solution, and which is removable after use with a photoresist stripping solution to enable a facile rework treatment of a substrate.

A third object of the present invention is to provide an undercoating material for a multilayer resist, which exhibits an excellent resistance to a photoresist developing solution and excellent patterning properties, and which is resistant to an alkaline compound, capable of preventing the adverse influence of poisoning on a resist pattern, and removable after use with a photoresist stripping solution to enable a facile rework treatment of a substrate.

A fourth object of the present invention is to provide an filler material for forming a dual damascene structure, which is capable of preventing the poisoning phenomenon while maintaining a property of entering into an etching space and easiness of removal after use.

A further object of the present invention is to provide a wiring formation method using the undercoating material and the filler material.

The present inventors have made an extensive study to solve the problems, and they have found that a good action and effect can be achieved by constituting an undercoating material containing, as a resin component, a resin having at least a substituent group which is capable of releasing a terminal group to form a sulfonic acid residue upon application of predetermined energy.

Further, the present inventors have found that, while a property of entering into an etching space and easiness of removal after use are maintained, the poisoning phenomenon can be prevented by constituting a filler material containing, as a resin component, a resin having at least a substituent group which is capable of releasing a terminal group to form a sulfonic acid residue upon application of predetermined energy.

That is, an undercoating layer formed using the undercoating material is highly resistant to a 2.38 wt % TMAH developing solution for developing a photoresist layer after exposure to light. Further, upon application of predetermined energy, some terminal groups in the resin component of the undercoating layer are converted into sulfonic acid groups, thus rendering the undercoating layer compatible with water-soluble amines or quaternary ammonium hydroxide. Since a solution containing such water-soluble amines and quaternary ammonium hydroxide can be used as a photoresist stripping solution, the undercoating layer can also be removed by stripping treatment of a photoresist or by stripping treatment of a silicon-containing upper photoresist.

When a predetermined energy is applied to the undercoating material for forming an undercoating layer, terminal groups in the resin component of the undercoating layer formed are converted into sulfonic acid groups. These terminal sulfonic acid groups render the undercoating layer compatible with water-soluble amines and quaternary ammonium hydroxide. A solution containing such water-soluble amines and quaternary ammonium hydroxide can be used as a resist stripping solution, and thus the undercoating layer can be easily removed with the resist stripping solution without corroding a low-dielectric layer. The undercoating layer can prevent the deterioration of a resist pattern caused by the poisoning phenomenon.

Accordingly, the present inventors have found that the undercoating layer formed from "the undercoating material containing, as a resin component, a resin having at least a substituent group which is capable of releasing a terminal group to form a sulfonic acid residue upon application of predetermined energy" is not deteriorated in photoresist development because of high resistance to a 2.38 wt % TMAH developing solution which is used usually in a photoresist development step, and can be easily removed with a photoresist stripping solution thereby not only simplifying the process but also preventing the deterioration of a dielectric layer in a substrate upon removal treatment.

That is, the undercoating material for lithography according to the present invention (hereinafter, "the first undercoating material of the present invention") is a material for forming an undercoating layer on a semiconductor substrate before formation of a photoresist for forming a wiring pattern on the substrate, which includes a resin component having at least a substituent group which is capable of releasing a terminal group to form a sulfonic acid residue upon application of predetermined energy, and a solvent.

The wiring formation method using the undercoating material (hereinafter, "the first wiring formation method of the present invention") includes steps of: forming an undercoating layer using the undercoating material for lithography; forming a photoresist layer on the undercoating layer and subjecting the photoresist layer to exposure and development treatment, to form a predetermined photoresist pattern; removing, by dry etching, an exposed portion of the undercoating layer not covered with the photoresist pattern, to pattern the undercoating layer; etching the substrate using the photoresist pattern and the patterned undercoating layer as the mask, to form a predetermined wiring pattern; and removing, with a photoresist stripping solution, both the undercoating layer and the photoresist pattern remaining on the substrate at the same time after formation of the wiring pattern.

The following effects can be achieved by the features of the first undercoating material and the first wiring formation method.
(1) The undercoating material of the present invention is insoluble in a photoresist developing solution. Accordingly, the deterioration of dimensional regulation inevitable for an undercoating layer capable of removal with the developing solution and attributable to skirting and side etching of a side wall from which the undercoating layer was removed is not problematic.
(2) The undercoating material can be removed with a photoresist stripping solution and is thus preferable as undercoating material used in a lithography process for a semiconductor substrate having a material poor in resistance to $O_2$ ashing plasma such as a low dielectric material having a dielectric constant (k) of 3.0 or less laminated thereon.
(3) When re-generation of the substrate is necessary due to deficient lithography, the undercoating layer can be easily removed by wet treatment with less damage to the substrate, and thus rework treatment for re-generation of the substrate can be carried out reliably and easily.

The undercoating material for a silicon bilayer resist according to the present invention (hereinafter, "the second undercoating material of the present invention") is an undercoating material for constituting a silicon bilayer resist for accurately forming a wiring layer on a substrate, which includes a resin component having at least a substituent group which is capable of releasing the terminal group to form the sulfonic acid residue upon application of predetermined energy, and a solvent.

The wiring formation method using this undercoating material (hereinafter, "the second wiring formation method of the present invention") includes steps of: forming an undercoating layer using the undercoating material for a silicon bilayer resist according to the present invention on a substrate; forming an upper resist layer using a silicon-containing photoresist material on the undercoating layer and subjecting the upper resist layer to exposure and development treatment, to form an upper layer resist pattern; removing, by dry etching, an exposed portion of the undercoating layer not covered with the upper resist pattern, to form a lower resist pattern; etching the substrate using the upper resist pattern and the lower resist pattern as the mask to form a predetermined wiring pattern; and removing, with a resist stripping solution, both the lower resist pattern and the upper resist pattern remaining on the substrate at the same time after formation of the wiring pattern.

The following effects can be achieved by the features of the second undercoating material and the second wiring formation method.
(1) The undercoating layer of the present invention can be removed with a photoresist stripping solution and is thus preferable as an undercoating material used in a lithography process for a semiconductor substrate having a material poor in resistance to $O_2$ ashing plasma such as a low dielectric material having a dielectric constant (k) of 3.0 or less laminated thereon.
(2) When re-generation of the substrate is necessary due to deficient lithography, the undercoating layer can be easily removed by wet treatment with less damage to the substrate, and thus rework treatment for regeneration of the substrate can be carried out reliably and easily. As a result, the problem of substrate regeneration treatment made difficult by a silicon-containing resist or an undercoating layer rendered sparingly soluble by denaturation upon $O_2$ plasma ashing can be prevented.

As described above, the present inventors have found that the undercoating layer for multilayer resist formed from "the undercoating material containing, as a resin component, a resin having at least a substituent group which is capable of releasing a terminal group to form a sulfonic acid residue upon application of predetermined energy" is not deteriorated in development of the upper resist layer because of high resistance to a 2.38 wt % TMAH developing solution used usually in a photoresist development step, and can be easily removed with a photoresist stripping solution thereby not only simplifying the process but also preventing deterioration of a dielectric layer of the substrate. Further, the present inventors could find that resist pattern defects attributable to the poisoning phenomenon can be prevented.

That is, the undercoating material for multilayer process according to the present invention (hereinafter, "the third undercoating material of the present invention") is an undercoating material for constituting a lithographic multilayer resist including at least an undercoating layer, an intermediate layer and a photoresist upper layer as a final pattern for forming a wiring layer accurately on a substrate, which includes a resin component having at least a substituent group which is capable of releasing a terminal group to form a sulfonic acid group upon application of predetermined energy, and a solvent.

The wiring formation method using the undercoating material (hereinafter, "the third wiring formation method of the present invention") includes steps of: forming an undercoating layer using the undercoating material for multilayer resist on a substrate; forming an intermediate layer using a silicon oxide film material on the undercoating layer; forming an upper photoresist layer on the intermediate layer and subjecting the upper photoresist layer to exposure and development treatment, to form a predetermined resist pattern; removing, by dry etching, an exposed portion of the intermediate layer not covered with the upper resist pattern, to form an intermediate layer pattern; removing, by dry etching, an exposed portion of the undercoating layer not covered with the intermediate layer resist pattern as the mask, to form an undercoating layer pattern; etching an interlaminar insulating layer on the substrate with the undercoating layer pattern as the mask to form a predetermined wiring pattern; and removing, with a photoresist stripping solution, the undercoating layer pattern remaining on the substrate after formation of the wiring pattern.

The following effects can be achieved by the features of the third undercoating material and the third wiring formation method.
(1) The undercoating layer of the present invention can be removed with a photoresist stripping solution and is thus preferable as an undercoating material used in a lithography process for a semiconductor substrate having a material poor in resistance to $O_2$ ashing plasma such as a low dielectric material having a dielectric constant (k) of 3.0 or less laminated thereon.
(2) When recovery of the substrate is necessary due to deficient lithography, the undercoating layer can be easily removed by wet treatment with less damage to the substrate, and thus rework treatment for recovery of the substrate can be carried out reliably and easily. As a result, the problem of substrate regeneration treatment made difficult by a silicon-containing resist or an undercoating layer rendered sparingly soluble by denaturation upon $O_2$ plasma ashing can be prevented.
(3) The undercoating layer for multilayer resist and the filler material in the dual damascene process can be commonly used to prevent deterioration of a resist pattern caused by the poisoning phenomenon which tends to occur upon formation of a dual damascene structure in a low-dielectric layer.

The present inventors have made further extensive study to solve the problem of the conventional filler material, and have found that, while a property of entering into an etching space and easiness of removal after use are maintained, the poisoning phenomenon can be prevented by constituting the filler material by incorporating, as a resin component, a resin having at least a substituent group which is capable of releasing a terminal group to form a sulfonic acid group upon application of predetermined energy.

That is, an undercoating layer formed from this filler material is highly resistant to a 2.38 wt % TMAH developing solution for developing a photoresist layer after exposure to light, and upon application of predetermined energy, some terminal groups in the resin component of the undercoating layer are converted into sulfonic acid groups, thus rendering the undercoating layer compatible with water-soluble amines or quaternary ammonium hydroxide. A solution containing such water-soluble amines and quaternary ammonium hydroxide can be used as a photoresist stripping solution, and the embedded material in a first etching space can be removed after formation of a second etching space.

Accordingly, the present inventors have found that an embedded material formed from "the filler material containing, as a resin component, a resin having at least a substituent group which is capable of releasing a terminal group to form a sulfonic acid group upon application of predetermined energy" is not deteriorated in resist development because of high resistance to a 2.38 wt % TMAH developing solution used usually in a photoresist development step, and can be easily removed with a photoresist stripping solution thereby not only simplifying the process but also preventing the deterioration of a dielectric layer on a substrate upon removal treatment and preventing pattern deterioration due to an alkaline component generated from the low-dielectric layer, to exhibit a high poisoning preventing property.

That is, the filler material for forming a dual damascene structure according to the present invention (hereinafter, "the filler material of the present invention") is a material to be embedded in an etching space for forming a dual damascene structure composed at least of a first etching space formed in a low dielectric layer on a substrate and a second etching space communicating with the first etching space and different in shape and dimension to those of the first etching space, which includes a resin component having at least a substituent group which is capable of releasing a terminal group to form a sulfonic acid group upon application of predetermined energy, and a solvent.

The method of forming a dual damascene structure using the filler material (hereinafter, "the fourth wiring formation method of the present invention") includes steps of: laminating an interlaminar insulating layer including at least a low-dielectric layer, on a substrate having a metal layer; forming a photoresist layer on the interlaminar insulating layer and subjecting the photoresist layer to patterned exposure and development treatment, to form a photoresist pattern; etching the interlaminar insulating layer with the photoresist pattern as the mask to form a first etching space in the interlaminar insulating layer; applying the filler material of the present invention onto the interlaminar insulating layer thereby forming an embedded material layer and simultaneously charging the embedded material into the first etching space; forming a photoresist layer on the embedded material layer, irradiating the photoresist layer with patterned light and developing it with an alkaline developing solution to form a photoresist pattern; performing etching using the photoresist pattern as the mask to remove the interlaminar insulating layer on the first etching space in a predetermined pattern to form a second etching space communicating with the first etching space; and removing, with a stripping solution, the embedded material remaining on the second etching space.

In the constitution described above, the first etching space indicates a trench or a via hole, and the second etching space indicates a via hole or a trench.

The following effects can be achieved by the features of the filler material of the present invention and the fourth wiring formation method of the present invention.

(1) The filler material used in the present invention is highly resistant to a gaseous and/or liquid alkaline component generated from a low-dielectric layer in the step of patterning the photoresist, and can thus prevent the poisoning phenomenon causing defects in the photoresist pattern by the alkaline component, whereby the etching space of dual damascene structure can be patterned with excellent dimensional stability.

(2) The embedded material can be removed with a photoresist stripping solution, and can thus be used preferably as an embedded material in an etching space used in a lithography process for dual damascene in a semiconductor substrate having a material poor in resistance to $O_2$ ashing plasma such as a low dielectric material having a dielectric constant (k) of 3.0 or less laminated thereon, whereby the low dielectric constant of the low-dielectric layer can be maintained in a suitable range after formation of a wiring layer.

The other objects, features, and advantages of the present invention are specifically set forth in or will become apparent from the following detailed descriptions of the invention when read in conjunction with the accompanying drawings.

DETAILED DESCRIPTIONS

Figure 1A:
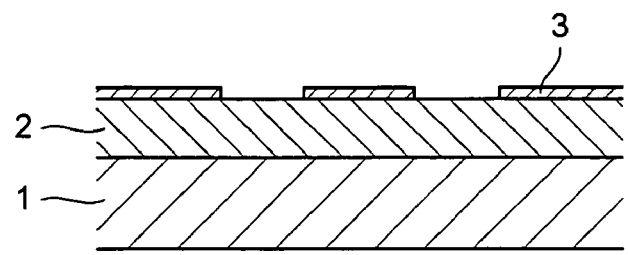
FIG. 1 explains a wiring formation method by a dual damascene process using a conventional filler material, wherein 1A to 1D are formation diagrams of a wiring structure by lithography.
Figure 1B:
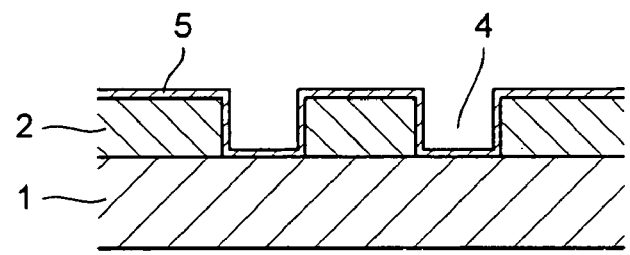
Figure 1C:
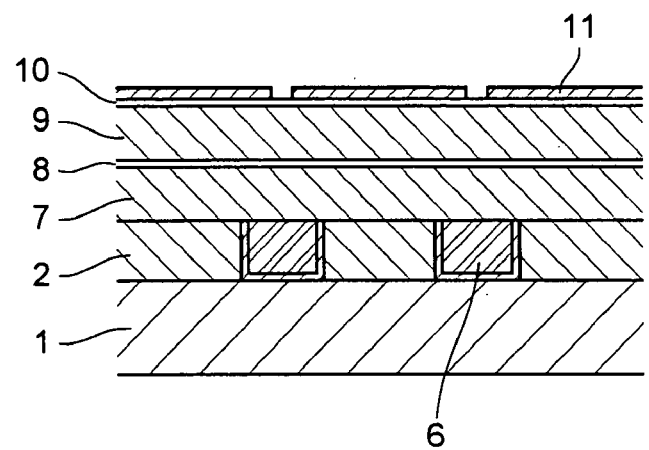
Figure 1D:
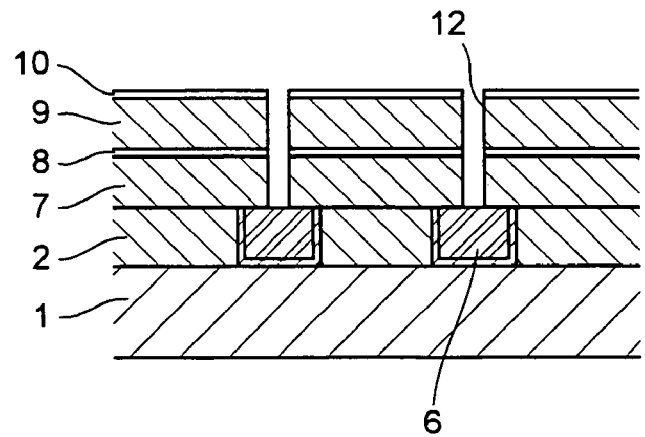
Figure 2E:
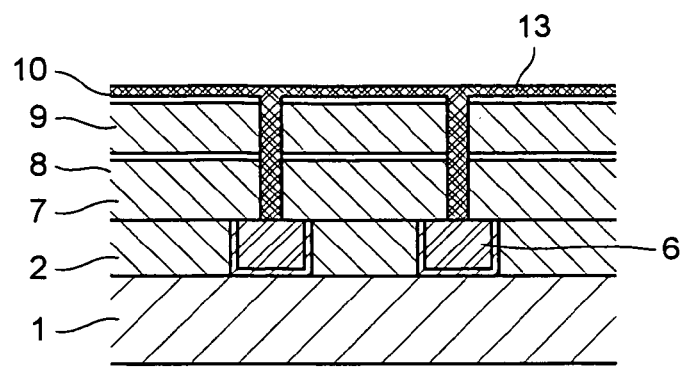
FIG. 2 explains a subsequent wiring formation method to that of FIG. 1, wherein 2E to 2H are formation diagrams of a wiring structure by lithography following that of FIG. 1D.
Figure 2F:
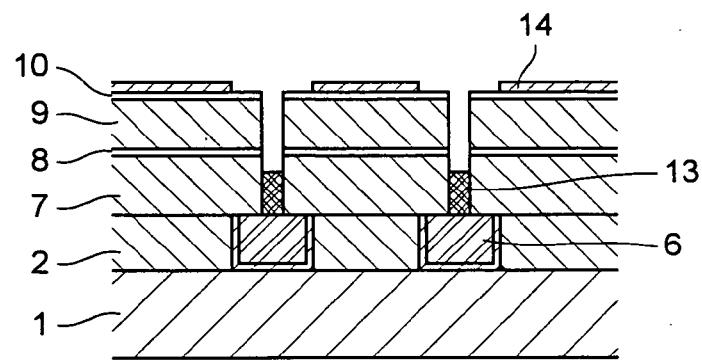
Figure 2G:
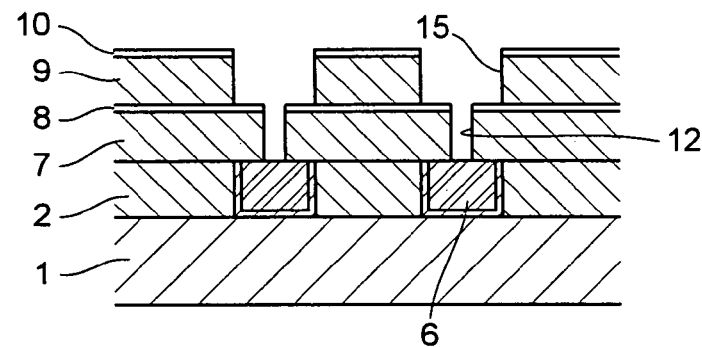
Figure 2H:
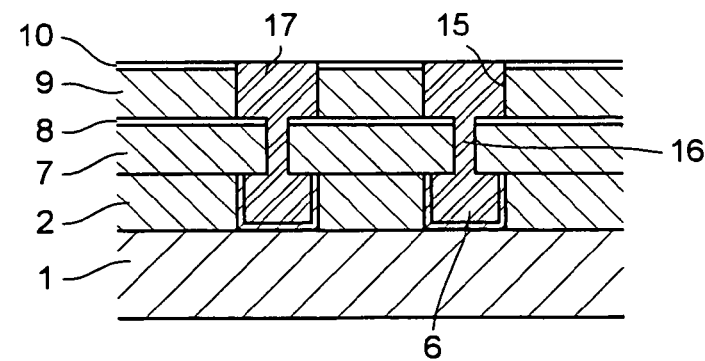
Figure 3A:
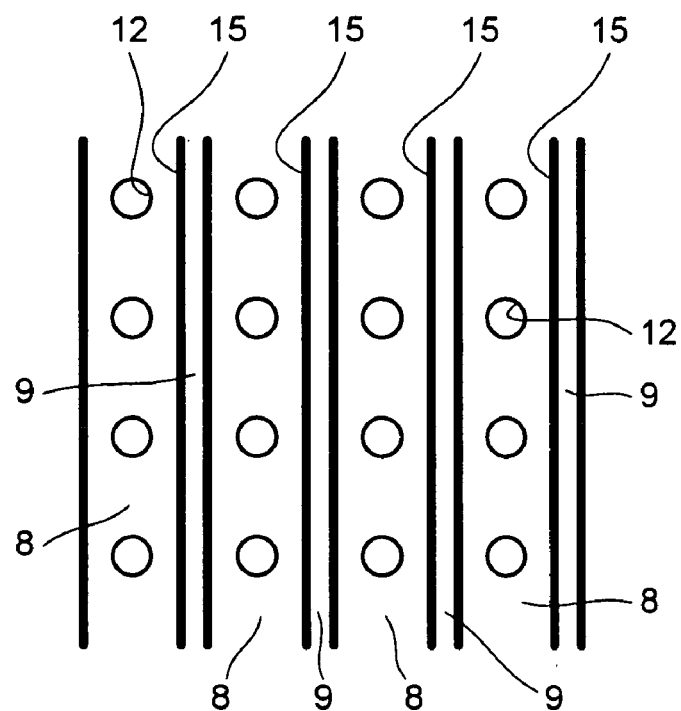
FIG. 3 explains a poisoning phenomenon which occurs upon formation of a dual damascene structure in a low-dielectric layer, wherein 3A is a plan view of an essential part of an etching space pattern where normal patterning was carried out without generating the poisoning phenomenon, and 3B is a plan view of an essential part of an etching space pattern where the poisoning phenomenon occurred to cause defects in patterning.
Figure 3B:
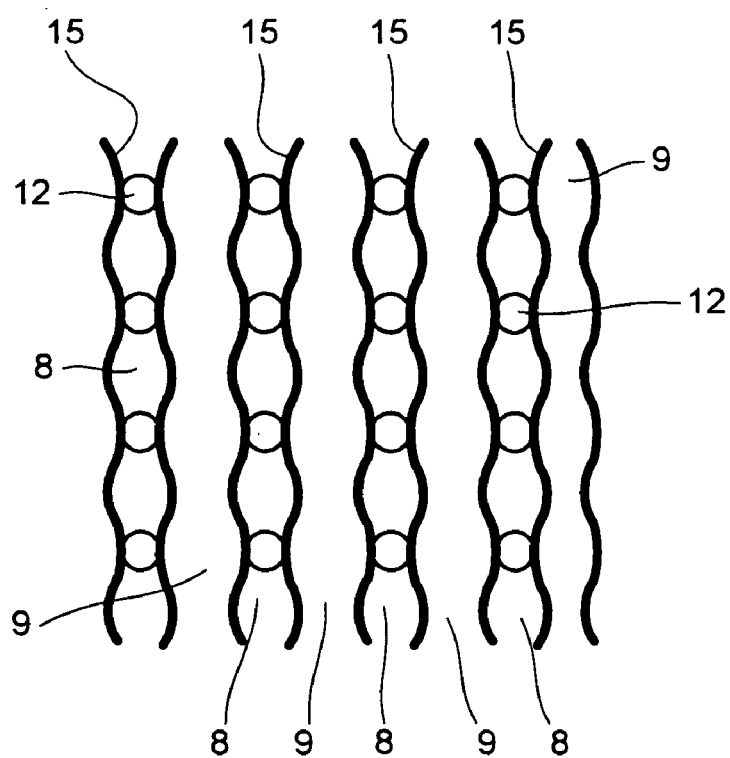
Figure 4A:
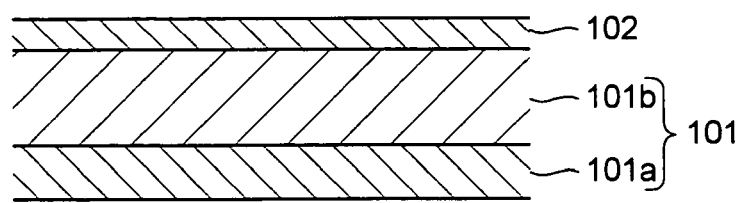
FIG. 4 explains a first wiring formation method using the first undercoating material of the present invention, wherein 4A to 4E are formation diagrams of a wiring structure by lithography.
Figure 4B:
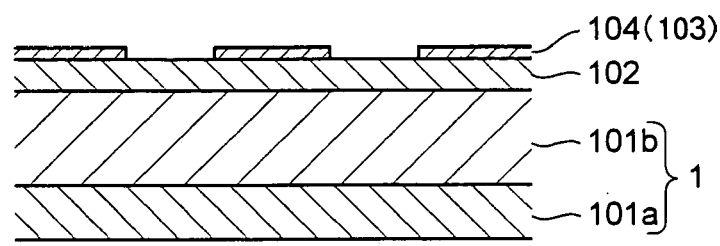
Figure 4C:
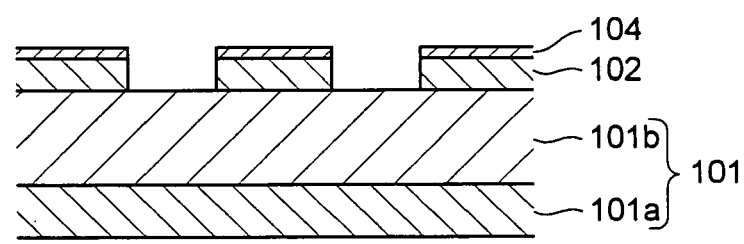
Figure 4D:
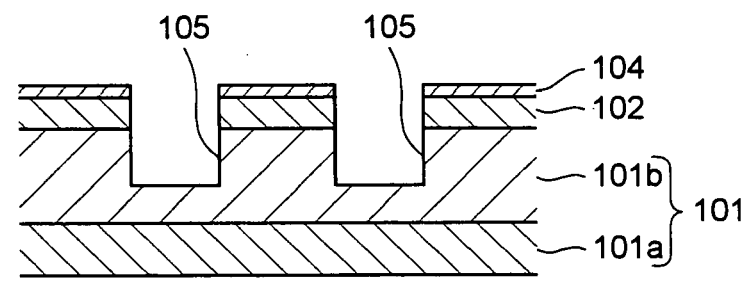
Figure 4E:
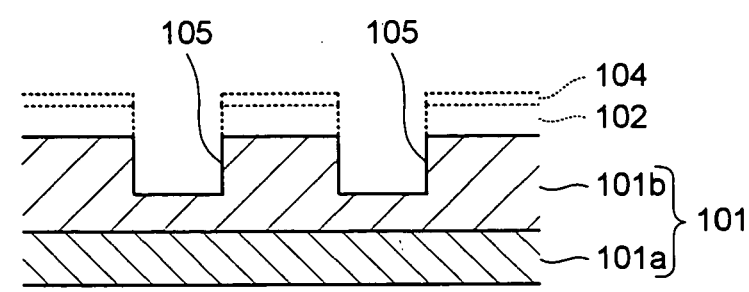
Figure 5A:
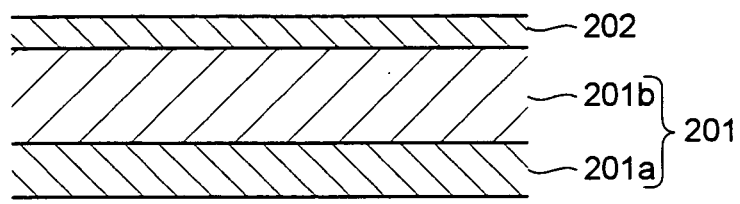
FIG. 5 explains a second wiring formation method using the undercoating material for silicon bilayer resist process according to the present invention (the second undercoating material), wherein 5A to 5E are formation diagrams of a wiring structure by lithography.
Figure 5B:
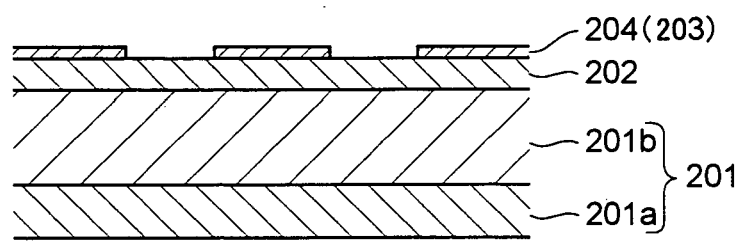
Figure 5C:
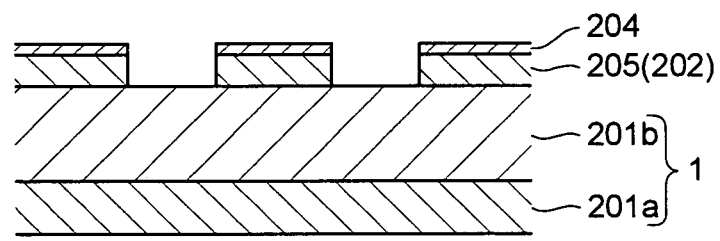
Figure 5D:
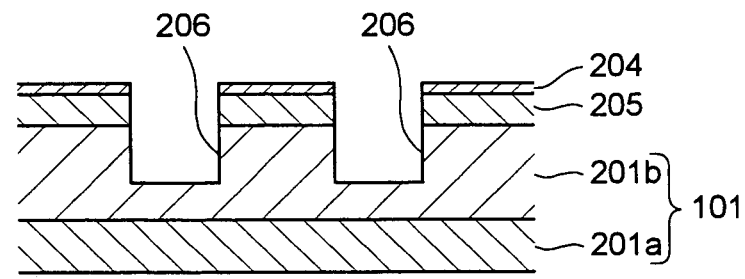
Figure 5E:
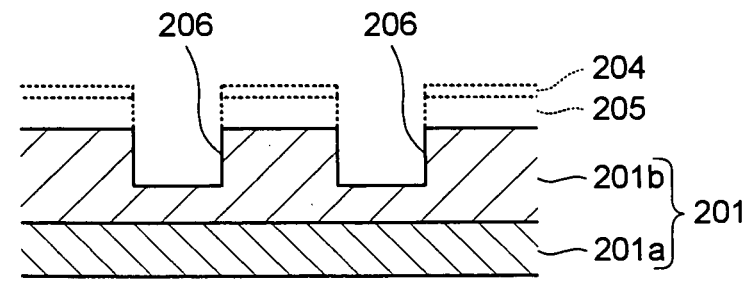

As described above, the first undercoating material (the undercoating material for lithography) is characterized by containing a resin component having at least a substituent group which is capable of releasing a terminal group to form a sulfonic acid residue upon application of predetermined energy, and a solvent.

As described above, the second undercoating material (the undercoating material for silicon bilayer resist process) is characterized by containing a resin component having at least a substituent group which is capable of releasing a terminal group to form a sulfonic acid residue upon application of predetermined energy, and a solvent.

As described above, the third undercoating material (the undercoating material for multilayer process) is characterized by containing a resin component having at least a substituent group which is capable of releasing a terminal group to form a sulfonic acid residue upon application of predetermined energy, and a solvent.

As described above, the filler material of the present invention (the filler material for forming a dual damascene structure) is characterized by containing a resin component having at least a substituent group which is capable of releasing a terminal group to form a sulfonic acid residue upon application of predetermined energy, and a solvent.

In the first, second and third undercoating material and the filler material, the resin component may be characterized by having at least a repeating unit represented by the following formula (1):

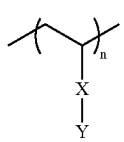
(1)

wherein n is an integer of 1 or more, X represents a C1 to C10 linear or branched alkyl chain, an aromatic or alicyclic alkyl chain or an alkyl ester chain, and Y is a substituent group which is capable of forming a sulfonic acid residue upon application of the predetermined energy.

The predetermined energy applied to form the sulfonic acid residue may be, for example, heat treatment at 80° C. or more which may result in generation of sulfonic acid residue. Application of such predetermined energy may be enforced by synergistic action of heat and an alkali in stripping treatment.

The substituent group Y in the formula (1) may preferably be —$SO_3R_1$ or —$SO_3^-R_2^+$ whereupon $R_1$ and $R_2$ each represent a monovalent organic group.

The organic group $R_1$ may preferably be one member selected from the group consisting of a C1 to C10 alkyl group and hydroxyalkyl group.

The organic group $R_2$ may preferably be at least one member selected from the group consisting of alkanolamine and alkylamine.

The resin component having at least a substituent group which is capable of releasing the terminal group to form the sulfonic acid residue upon application of the predetermined energy may preferably be a copolymer or a mixed resin containing any of the aforementioned resin component, and acrylic acid or methacrylic acid or a derivative thereof.

When the copolymer or mixed resin is used as the resin component, the polymerization ratio or mixing ratio is not particularly limited in such a range that the copolymer or mixed resin is resistant to the 2.38 wt % TMAH developing solution and can be removed with the resist stripping solution.

The resin component having at least a substituent group which is capable of releasing the terminal group to form the sulfonic acid residue upon application of the predetermined energy may be a resin component consisting of:

a copolymer of the copolymer or the mixed resin of any of the aforementioned resin component and acrylic acid or methacrylic acid or a derivative thereof, and the repeating unit represented by the following formula (2):

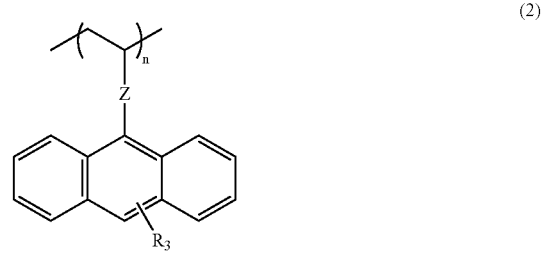
(2)

wherein n is an integer of 1 or more, $R_3$ is at least one member selected from the group consisting of a hydrogen atom, a fluorine atom, a hydroxyl group, a carboxyl group, a C1 to C5 hydroxyalkyl group and a C1 to C5 alkoxyalkyl group, and Z represents a C1 to C10 linear or branched alkyl chain, an aromatic or alicyclic linear alkyl chain or alkyl ester chain; or a mixed resin of the copolymer or the mixed resin of any of the aforementioned resin component and acrylic acid or methacrylic acid or a derivative thereof, together with a resin compound having the repeating unit represented by the formula (2).

When a copolymer is prepared using the derivative of the formula (2), and the copolymer is used as a resin component to form an undercoating material, anthracene is contained in a unit of the resin component, which is preferable because anthracene has high absorption characteristics in lithography particularly using a KrF excimer laser.

The solvent used in the undercoating material of the present invention may be those without particular limitation which is used in conventional undercoating materials.

Specifically, the solvent may include, for example, ketones such as acetone, methyl ethyl ketone, cyclopentanone, cyclohexanone, methyl isoamyl ketone, 2-heptanone and 1,1,1-trimethyl acetone; polyvalent alcohols such as ethylene glycol, ethylene glycol monomethyl ether, ethylene glycol monoethyl ether, ethylene glycol monobutyl ether, ethylene glycol monoacetate, ethylene glycol monomethyl ether acetate, ethylene glycol monoethyl ether acetate, diethylene glycol, diethylene glycol monoacetate, diethylene glycol monomethyl ether, diethylene glycol monoethyl ether, diethylene glycol monobutyl ether, propylene glycol, propylene glycol monomethyl ether, dipropylene glycol monomethyl ether, glycerine, 1,2-butylene glycol, 1,3-butylene glycol and 2,3-butylene glycol, as well as derivatives thereof; cyclic ethers such as dioxane; esters such as ethyl lactate, methyl acetate, ethyl acetate, butyl acetate, methyl pyruvate, ethyl pyruvate, methyl 3-methoxypropionate and ethyl 3-ethoxypropionate; sulfoxides such as dimethyl sulfoxide; sulfones such as dimethyl sulfone, diethyl sulfone, bis(2-hydroxyethyl)sulfone and tetramethylene sulfone; amides such as N,N-dimethylformamide, N-methylformamide, N,N-dimethylacetamide, N-methylacetamide and N,N-diethylacetamide; lactams such as N-methyl-2-pyrrolidone, N-ethyl-2-pyrrolidone, N-hydroxymethyl-2-pyrrolidone and N-hydroxyethyl-2-pyrrolidone; lactones such as β-propiolactone, γ-butyrolactone, γ-valerolactone, δ-valerolactone, γ-caprolactone and ε-caprolactone; imidazolidinones such as 1,3-dimethyl-2-imidazolidinone, 1,3-diethyl-2-imidazolidinone and 1,3-diisopropyl-2-imidazolidinone; and so on. These can be used alone or as a mixture of two or more thereof.

The undercoating material according to the present invention may contain a crosslinking agent. The crosslinking agent is not particularly limited insofar as it can crosslink the resin component used in the present invention, but it is preferably a nitrogen-containing compound containing amino groups and/or imino groups wherein at least two hydrogen atoms in all amino groups and/or imino groups were replaced by hydroxyalkyl groups and/or alkoxyalkyl groups.

The number of the substituent groups on the nitrogen-containing compound shall be two or more, and substantially six or less.

Examples of the crosslinking agent may include melamine compounds, urea compounds, guanamine compounds, acetoguanamine compounds, benzoguanamine compounds, glycoluril compounds, succinylamide compounds and ethylene urea compounds, wherein at least two hydrogen atoms in amino groups and/or imino groups were replaced by methylol groups and/or alkoxymethyl groups.

These nitrogen-containing compounds may be obtained for example by converting the melamine compounds, urea compounds, guanamine compounds, acetoguanamine compounds, benzoguanamine compounds, glycoluril compounds, succinylamide compounds or ethylene urea compounds into their corresponding methylol derivatives by reaction with formalin in boiling water, or by converting them into the corresponding alkoxides by reaction with lower alcohols such as methanol, ethanol, n-propanol, isopropanol, n-butanol or isobutanol.

The crosslinking agent is preferably a condensation product of the hydroxyalkyl group and/or alkoxyalkyl group with a monohydroxy monocarboxylic acid in order to achieve an effect of improving the shape of a lower part of the resist pattern (prevention of footing).

The monohydroxy monocarboxylic acid is preferably the one having a hydroxyl group and a carboxyl group bound to the same carbon atom or to two adjacent carbon atoms respectively in order to prevent footing.

When the condensation product with a monohydroxy monocarboxylic acid is used, a reaction product obtained by reacting the monohydroxy carboxylic acid in an amount of 0.01 to 6 moles, preferably 0.1 to 5 moles, per mole of the crosslinking agent before condensation, is preferably used to achieve an effect of preventing footing. The condensation reaction may be carried out in accordance with a conventional method.

In the first, the second, and the third undercoating materials and the filler material according to the invention, one species of the crosslinking agent may be used, or two or more species of the crosslinking agents may be used as a mixture.

A highly light-absorbing component, an acidic compound and a surfactant may be added if necessary to the first undercoating material and the filler material in the invention. A highly light-absorbing component, an acidic compound and a surfactant may be added if necessary to the second and the third undercoating materials in the invention.

The effect of the highly light-absorbing component added lies in further improvements in exposure light absorption characteristics. The highly light-absorbing component is not particularly limited insofar as it has high absorption characteristics for exposure light on the photoresist layer thereby preventing a standing wave generated by reflection of exposure light on the substrate or irregular reflection caused by an uneven surface of the substrate. Examples of such compounds may include salicylate compounds, benzophenone compounds, benzotriazole compounds, cyanoacrylate compounds, azo compounds, polyene compounds, anthraquinone compounds, sulfone compounds (preferably bisphenylsulfone compounds), sulfoxide compounds (bisphenylsulfoxide compounds) and anthracene compounds. These compounds may be used alone or as a mixture of two or more thereof.

In particular, the anthracene compounds, bisphenylsulfone compounds, bisphenylsulfoxide compounds and benzophenone compounds having at least one substituent group selected from the group consisting of a hydroxyl group, a hydroxyalkyl group, an alkoxyalkyl group and a carboxyl group have high absorption characteristics, and therefore, at least one member selected from these compounds is preferably used. Particularly preferable among these compounds are for example the anthracene compounds or bisphenylsulfone compounds. These compounds may be used alone or as a mixture of two or more thereof.

The effect of the acidic compound added lies in improvement of the footing-preventing properties. The acidic compound may include organic or inorganic acids having a sulfur-containing acid residue, or esters thereof, and compounds generating an acid with active rays (acid generators, for example onium salts) etc. The amount of the acidic compound blended may be 30 parts by weight or less, preferably 20 parts by weight or less, based on 100 parts by weight of the total solid content in the first undercoating material and the filler material in the invention, or the amount of the acidic compound may be 0.01 to 30 parts by weight, preferably 0.1 to 20 parts by weight, based on 100 parts by weight of the total solid content in the second and the third undercoating materials of the present invention. When the amount is too small, the effect of the acidic compound added cannot be obtained, while when the amount is higher than the above range, a bite may occur in a lower part of a resist pattern.

The effect of the surfactant added is to improve the coating properties of the undercoating material or to improve the coating properties of the filler material and the property of the filler material to enter into an etching space. The surfactant may include fluorine type surfactants such as Surflon SC-103 and SR-100 (both by Asahi Glass Co., Ltd.), EF-351 (Touhoku Hiryo Corporation), Florard Fc-431, Florard Fc-135, Florard Fc-98, Florard Fc-430, Florard Fc-176 (foregoing by Sumitomo 3M Limited), and Megafack R-08 (Dainippon Ink and Chemicals, Incorporated).

The amount of the surfactant added is determined preferably in the range of less than 200 parts per million based on the whole total solid content of the undercoating material.

The first wiring formation method of the present invention will be described again in more detail by reference to FIG. 4. In the first wiring formation method of the present invention, an undercoating layer 102 is formed using the undercoating material for lithography according to the present invention on a semiconductor substrate 101 having a dielectric layer 101b laminated on substrate 101a such as silicon wafer (an undercoating layer formation step (a)).

Subsequently, a photoresist layer 103 is formed on the undercoating layer 102. The photoresist layer 103 is subjected to exposure and development treatment, to form a predetermined photoresist pattern 4 (photoresist pattern formation step (b)).

An exposed portion of the undercoating layer 102 which is not covered with the photoresist pattern 104 is removed by dry etching (undercoating layer patterning step (c)).

The dielectric layer 101b of the substrate 101 is etched using the photoresist pattern 104 and the patterned undercoating layer 102 as the mask to form a predetermined wiring pattern 105 (wiring pattern formation step (d)).

Both the undercoating layer 102 and the photoresist pattern 104 remaining on the substrate 1 after forming the wiring pattern 105 are simultaneously removed with a photoresist stripping solution (undercoating layer removal step (e)).

The wiring formation method of the present invention includes the steps (a) to (e). For example, a conductive material is embedded in the wiring pattern 105, whereby a wiring layer is formed. The simplest wiring structure is assumed in the description of this method, but as a matter of course, the method of the present invention is also applicable to a multilayer wiring structure including a plurality of layers wherein upper and lower ones of them are electrically connected to each other through a via wire. In the constitution of the method of this invention, minimum necessary steps are shown. In this method, a damascene process is assumed, but when a multilayer structure is desired, a dual damascene process will be inevitably used. In the dual damascene process, a wiring groove called a trench and a via hole are continuously formed. The trench may be first formed and then the via hole may be formed, or the via hole may be first formed and then the trench may be formed. The present invention is applicable to ether case.

Subsequently, the second wiring formation method of the present invention will be described again in more detail by reference to FIG. 5. In the second wiring formation method of the present invention, an undercoating layer 202 is formed using the undercoating material for silicon-containing 202 layer resist according to the present invention on a semiconductor substrate 201 having at least a dielectric layer 201b laminated on substrate 201a such as silicon wafer (undercoating layer formation step (a)).

Subsequently, an upper resist layer 203 consisting of a silicon-containing photoresist material on the undercoating layer 202. The upper resist layer 203 is then subjected to exposure and development treatment, to form a predetermined photoresist pattern 4 (upper resist pattern formation step (b)).

An exposed portion of the undercoating layer 202 which is not covered with the upper resist pattern 204 is removed by dry etching, to form a lower resist pattern 205 (lower resist pattern formation step (c)).

The dielectric layer 201b of the substrate 201 is etched using the upper resist pattern 204 and the lower resist pattern 205 as the mask to form a predetermined wiring pattern 206 (wiring pattern formation step (d)).

Both the lower resist pattern 205 and the upper resist pattern 204 remaining on the substrate 201 after formation of the wiring pattern 206 is simultaneously removed by the photoresist stripping solution (resist pattern removal step (e)).

The wiring formation method of the present invention includes the steps (a) to (e). For example, a conductive material may be embedded in the wiring pattern 206, whereby a wiring layer is formed. The simplest wiring structure is assumed in the description of this method, but as a matter of course, the method of the present invention is also applicable to a multilayer wiring structure including a plurality of layers wherein upper and lower ones of them are electrically connected to each other through a via wire. In the constitution of the method of this invention, minimum necessary steps are shown. In this method, a damascene process is assumed, but when a multilayer structure is desired, a dual damascene process will be inevitably used. In the dual damascene process, a wiring groove called a trench and a via hole are continuously formed. The trench may be first formed and then the via hole may be formed, or the via hole may be first formed and then the trench may be formed. The present invention is applicable to ether case.

Figure 6A:
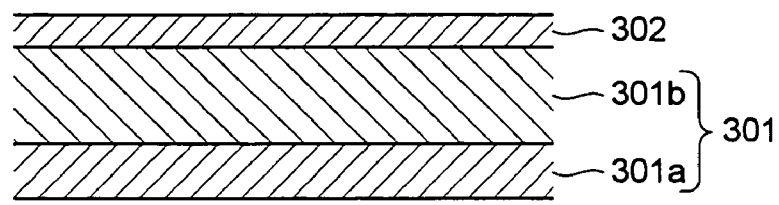
FIG. 6 explains a third wiring formation method using the undercoating material for multilayer process according to the present invention (the third undercoating material), wherein 6A to 6D are the former part of the diagrams for forming a wiring structure by lithography.

Subsequently, the third wiring formation method of the present invention will be described in more detail by reference to FIGS. 6A to 6D and FIGS. 7E to 7H. In the third wiring formation method of the present invention, a thick undercoating layer 302 is formed using the lower multilayer resist layer material of the present invention on a semiconductor substrate 301 having a dielectric layer 301b laminated on a substrate 301a such as silicon wafer (undercoating layer formation step (a)) as illustrated in FIG. 6A.

Figure 6B:
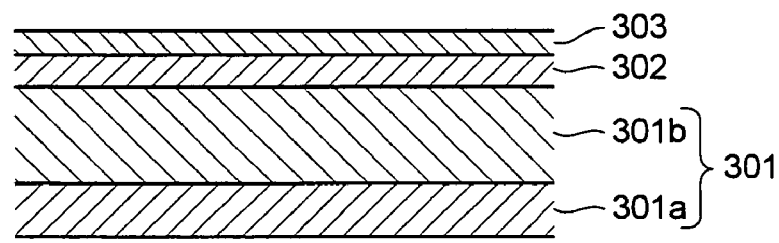

An intermediate layer 303 is then formed using a spin-on-glass material on the undercoating layer 302 (intermediate layer formation step (b)) as illustrated in FIG. 6B.

Figure 6C:
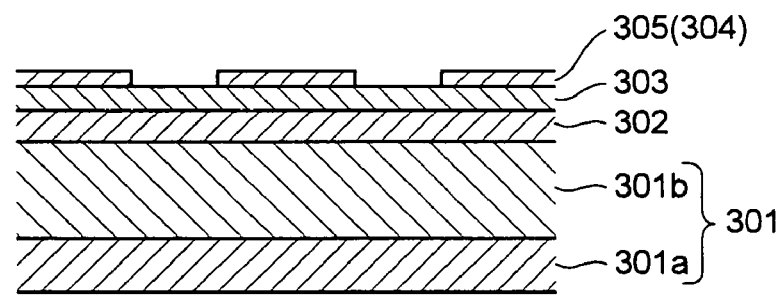

An upper resist layer 304 consisting of a photoresist material is then formed on the intermediate layer 303. The upper resist layer 304 is subjected to exposure and development treatment, to form a predetermined photoresist pattern 305 (upper resist pattern formation step (c)) as illustrated in FIG. 6C.

Figure 6D:
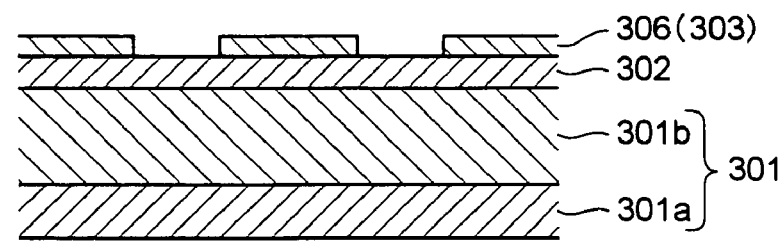

The intermediate layer 303 is then processed by the dry etching using the upper resist pattern 305 as the mask, to form an intermediate layer pattern 306 (intermediate layer pattern formation step (d)) as illustrated in FIG. 6D.

Figure 7E:
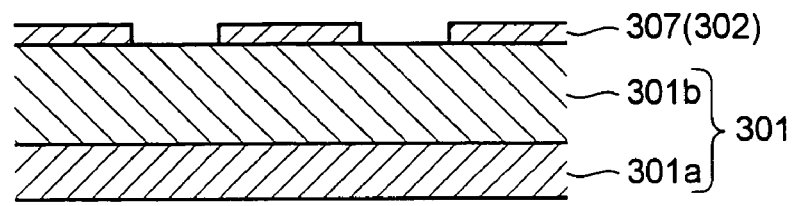
FIG. 7 explains a third wiring formation method using the undercoating material for multilayer process according to the present invention (third undercoating material), wherein 7E to 7F are the latter part of the diagrams for forming a wiring structure by lithography, following that of FIG. 6D.

The undercoating layer 302 is then processed by dry etching using the intermediate layer pattern 306 as the mask, to form an undercoating layer pattern 307 (undercoating layer pattern formation step (e)) as illustrated in FIG. 7E.

Figure 7F:
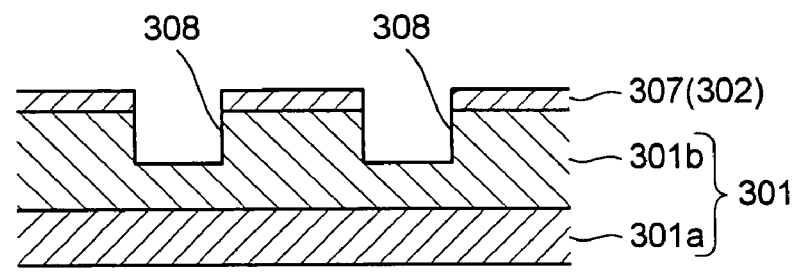

The dielectric layer 301b of the substrate 301 is then etched using the undercoating layer pattern 307 as the mask, to form a predetermined wiring pattern 308 (wiring pattern formation step (f)) as illustrated in FIG. 7F.

Figure 7G:
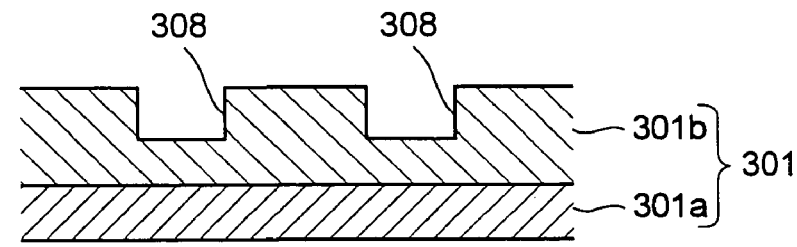

The lower resist pattern 307 remaining on the substrate 301 after formation of the wiring pattern 306 is then removed by the photoresist stripping solution (resist pattern removal step (g)) as illustrated in FIG. 7G.

Figure 7H:
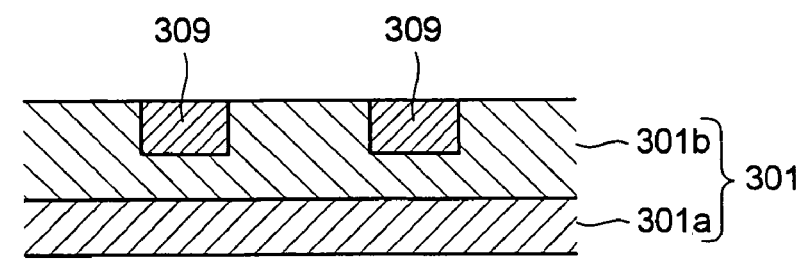

Finally, on the wiring pattern 308, a conductive material is deposited by a gaseous phase process, or a conductive material is embedded therein, thereby a wiring layer 309 is formed (wiring layer formation step (h)) as illustrated in FIG. 7H.

The third wiring formation method of the present invention includes at least the steps (a) to (g). The simplest wiring structure is assumed in the description of this method, but as a matter of course, the method of the present invention is also applicable to a multilayer wiring structure including a plurality of layers wherein upper and lower ones of them are electrically connected to each other through a via wire. In the constitution of the method of this invention, minimum necessary steps are shown. In this method, a damascene process is assumed, but when a multilayer structure is desired, a dual damascene process will be inevitably used. In the dual damascene process, a wiring groove called a trench and a via hole are continuously formed. The trench may be first formed and then the via hole may be formed, or the via hole may be first formed and then the trench may be formed. The present invention is applicable to ether case.

Subsequently, one example of the fourth wiring formation method of the present invention (dual damascene structure formation method) will be described in more detail by reference to FIGS. 8A to 8D and FIGS. 9E to 9I.

Figure 8A:
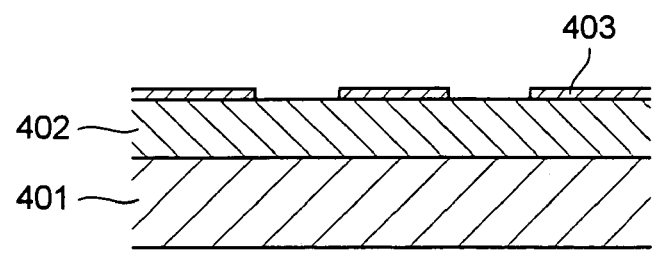
FIG. 8 explains the wiring formation method by dual damascene process using the filler material of the present invention (the fourth wiring formation method), wherein 8A to 8D are formation diagrams of a wiring structure by lithography.
Figure 8B:
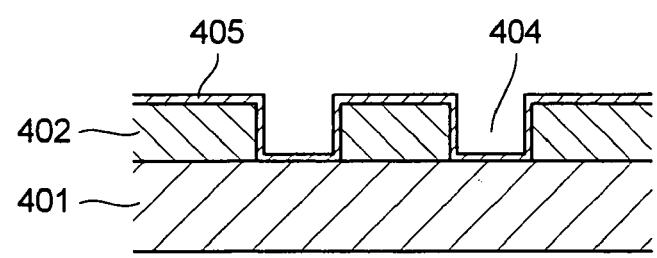
Figure 8C:
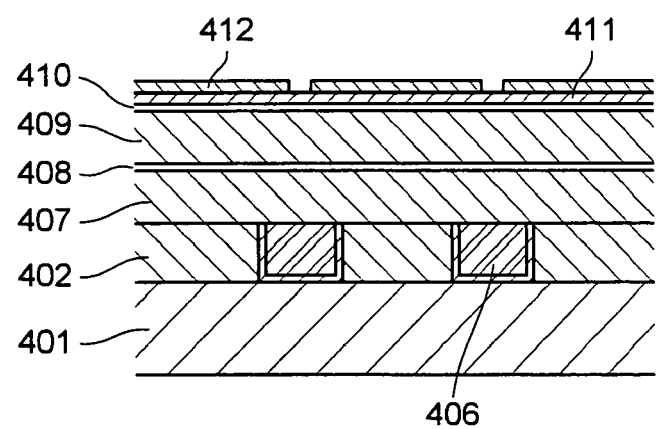

A low-dielectric layer (interlaminar insulating layer) 402 is formed on substrate 401, as illustrated in FIG. 8A. A resist layer 403 is formed and patterned on the low-dielectric layer 402. The low-dielectric layer 402 is etched selectively using the patterned resist layer 403 as the mask, and then the resist layer 403 is removed, whereby a wiring groove (trench) 404 is formed as illustrated in FIG. 8B. A barrier metal 405 is then deposited on the surface of the low-dielectric layer 402 having the wiring groove 404 formed therein as described above, to form a barrier metal film inside the wiring groove 404. By the film, the adhesion between copper to be embedded in the wiring groove 404 and the low-dielectric layer 402 is improved, and diffusion of copper into the low-dielectric layer 402 is prevented. As illustrated in FIG. 8C, copper is then embedded in the wiring groove 404 by electrolytic plating etc., to form a lower wiring layer 406.

Copper adhering to the surface of the low-dielectric layer 402, and the remaining barrier metal 405 are then removed by CMP, to flatten the surface of the low-dielectric layer 402. A first low-dielectric layer 407, a first etching stopper film 408, a second low-dielectric layer 409 and a second etching stopper film 410 are laminated in this order thereon (interlaminar insulating layer formation step).

Figure 8D:
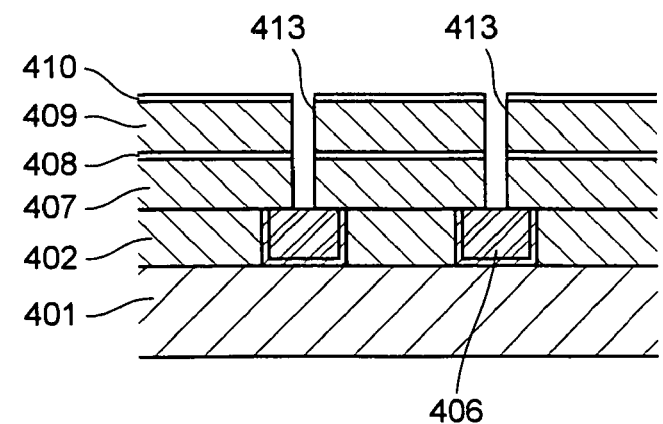

An anti reflective coating film 411 is then formed on the second etching stopper film 410. A resist is applied onto the anti reflective coating film 411 and then subjected to patterning for formation of a via hole to form a resist mask 412. As illustrated in FIG. 8D, the resist mask 412 is then used in etching, whereby a via hole 413 penetrating the anti reflective coating film 411, the second etching stopper film 410, the second low-dielectric layer 409, the first etching stopper layer 408, and the first dielectric layer 407 and reaching the surface of the lower layer wiring layer 406 is formed (first etching space formation step).

Figure 9E:
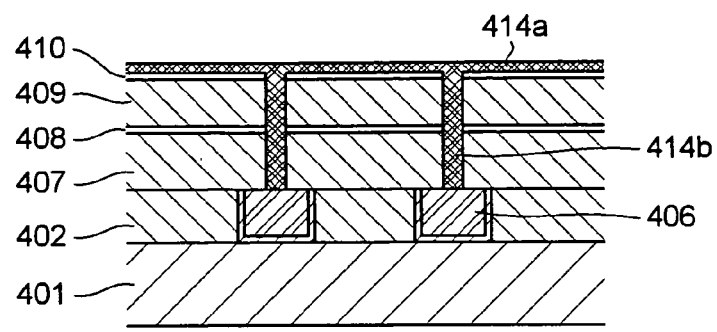
FIG. 9 explains the subsequent wiring formation method to that of FIG. 8, wherein 9E to 9I are formation diagrams of a wiring structure by lithography following that of FIG. 8D.

Subsequently, the resist mask 412 and the anti reflective coating film 411 are removed, and as illustrated in FIG. 9E, the filler material for forming the dual damascene structure of the present invention is applied onto the second etching stopper 410, and embedded in the first etching space 413, to form the embedded material layer 414a as well as the embedded material 414b in the first etching space 413 (embedding step).

Figure 9F:
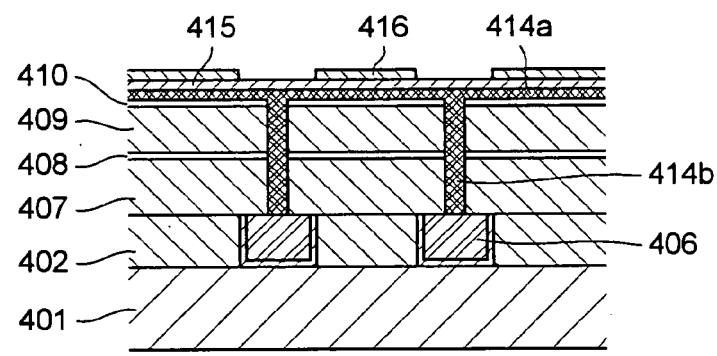

As illustrated in FIG. 9F, an anti reflective coating film 415 capable of processing with dry etching is laminated on the embedded material layer 414, then a trench-forming photoresist is applied on the anti reflective coating layer 415, and the photoresist layer is irradiated with pattern light and developed with an alkaline developing solution to form a photoresist pattern 416 (photoresist pattern formation step).

Figure 9G:
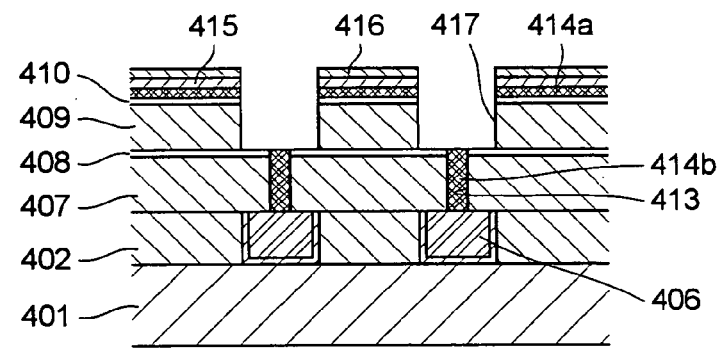

An exposed portion of the anti reflective coating film 415 not covered with the resist pattern 416 is then processed by dry etching with the resist pattern 416 as the mask. The resist pattern 416 is used in etching the second etching stopper film 410 and the second low-dielectric layer 409 to form a trench 417 as illustrated in FIG. 9G (second etching space formation step).

Figure 9H:
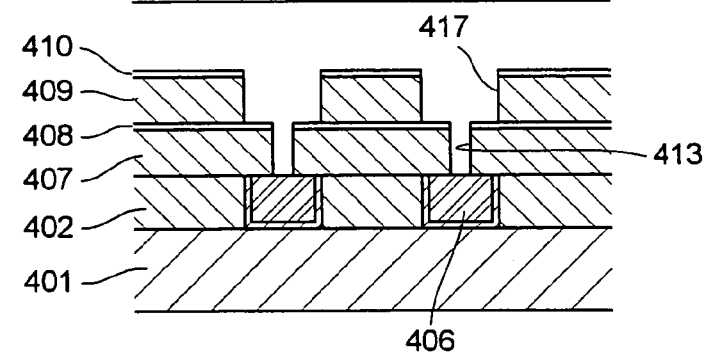

Thereafter, the embedded material 414a in the via hole 413, together with both the photoresist pattern 416 and the anti reflective coating film 415, is completely removed with a stripping solution. At this point, a dual damascene structure including the trench 417 and the via hole 413 is formed as illustrated in FIG. 9H.

Figure 9I:
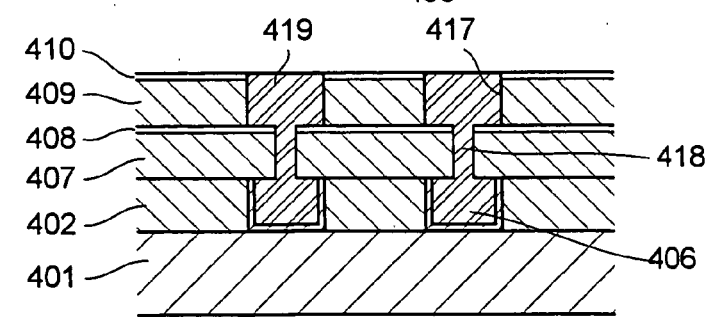

Subsequently, copper is embedded in the via hole 413 and the trench 417 to form a via wire 418 and upper wiring layer 419 simultaneously as illustrated in FIG. 9I. A multilayer wiring structure having the lower wiring layer 406 connected through the via wire 418 to the upper layer wiring layer 419 is thus realized.

In the above description, the via hole is first formed, but the trench may be first formed, and it is evident that the present invention is applicable to ether case.

In the above description, the step of forming the anti reflective coating film 415 is arranged after the embedding step, and the step of processing the anti reflective coating film using the photoresist pattern 416 as the mask is arranged after the step of forming the photoresist pattern 416, but these are not particularly essential steps in the method of the present invention. However, when the anti reflective coating film 415 is provided, exposure light or heating energy for forming the resist pattern 416 can be prevented from exerting adverse influence on the low-dielectric layer 409, thus preventing occurrence of the poisoning phenomenon more reliably.

Preferably, the photoresist stripping solution used in the undercoating layer removal step (e) in the first wiring formation method, the resist pattern removal step (e) in the second wiring formation method, the undercoating layer pattern removal step (g) in the third wiring formation method, and the embedded material removal step (h) in the fourth wiring formation method contains at least one member selected from the group consisting of a water-soluble amine and quaternary ammonium hydroxide. A photoresist stripping solution containing the quaternary ammonium hydroxide is particularly preferably used.

The water-soluble amine is at least one member selected from the group consisting of alkanolamine and alkylamine.

The stripping agent in a system containing the amine-based stripping solution may further be blended with a non-amine-based water-soluble organic solvent, water, a preservative, a surfactant, etc.

The non-amine-based water-soluble organic solvent may include, for example, sulfoxides such as dimethyl sulfoxide; sulfones such as dimethyl sulfone, diethyl sulfone, bis(2- hydroxyethyl)sulfone and tetramethylene sulfone; amides such as N,N-dimethylformamide, N-methylformamide, N,N-dimethylacetamide, N-methylacetamide and N,N-diethylacetamide; lactams such as N-methyl-2-pyrrolidone, N-ethyl-2-pyrrolidone, N-hydroxymethyl-2-pyrrolidone and N-hydroxyethyl-2-pyrrolidone; lactones such as β-propiolactone, γ-butyrolactone, γ-valerolactone, δ-valerolactone, γ-caprolactone and ε-caprolactone; imidazolidinones such as 1,3-dimethyl-2-imidazolidinone, 1,3-diethyl-2-imidazolidinone and 1,3-diisopropyl-2-imidazolidinone; polyvalent alcohols such as ethylene glycol, ethylene glycol monomethyl ether, ethylene glycol monoethyl ether, ethylene glycol monobutyl ether, ethylene glycol monoacetate, ethylene glycol monomethyl ether acetate, ethylene glycol monoethyl ether acetate, diethylene glycol, diethylene glycol monoacetate, diethylene glycol monomethyl ether, diethylene glycol monoethyl ether, diethylene glycol monobutyl ether, propylene glycol, propylene glycol monomethyl ether, dipropylene glycol monomethyl ether, glycerine, 1,2-butylene glycol, 1,3-butylene glycol and 2,3-butylene glycol; and derivatives thereof. These can be used alone or as a mixture of two or more thereof.

In the method of the present invention, a step of contacting the undercoating layer with ozone water and/or hydrogen peroxide water may be arranged before the stripping treatment of the undercoating layer. Ozone water is preferably pure water containing an ozone gas dissolved therein which is produced by a method such as bubbling. The concentration of ozone may be from 1 part per million to saturation concentration, and hydrogen peroxide water may be an aqueous solution containing hydrogen peroxide at a concentration of 0.1 to 60% by weight. The contact method may include a dipping method, a puddle method, a shower method, etc. By conducting such pre-treatment, the first wiring formation method can improve performance for removing the undercoating layer and the photoresist layer, and the second and the third wiring formation methods can improve performance for removing the undercoating layer and the upper resist layer.

In the first and the fourth wiring formation methods of the present invention, the photoresist composition for forming the photoresist layer is not particularly limited, and the photoresist composition may be any of photoresist compositions used generally with i- and g-line from a mercury lamp and exposure light from a KrF excimer laser, ArF excimer laser, and $F_2$ excimer laser.

As the silicon-containing photoresist composition for forming the upper resist layer in the second wiring formation method of the present invention, the one described in the Japanese Patent Application Laid-open No. 2002-033257 may be used in an analogous manner.

In the photoresist composition for forming the upper resist layer in the third wiring formation method of the present invention, a photoresist material used conventionally with KrF, ArF, and $F_2$ excimer lasers or with electron beam may be used in a usual manner.

In the first to the fourth wiring formation methods of the present invention, exposure and development treatment can be carried out using a conventional process in usual lithography.

In the third wiring formation method of the present invention, the silicon oxide film material for forming the intermediate layer may be selected from various silicon-containing polymers. In particular, a spin-on-glass material may be preferably used. The spin-on-glass material may be a material obtained by hydrolyzing, with the action of an acid in the presence of water, at least one compound selected from compounds represented by the following formulae:

$$Si(OR^1)_a(OR^2)_b(OR^3)_c(OR^4)_d \quad (A)$$

wherein $R^1$, $R^2$, $R^3$, and $R^4$ independently represent a C1 to C4 alkyl group or a phenyl group, and each of a, b, c, and d is an integer satisfying the following relationships: $0 \leq a \leq 4$, $0 \leq b \leq 4$; $0 \leq c \leq 4$, $0 \leq d \leq 4$; and a+b+c+d=4,

$$R^5Si(OR^6)_e(OR^7)_f(OR^8)_g \quad (B)$$

wherein $R^5$ represents a hydrogen atom or a C1 to C4 alkyl group, $R^6$, $R^7$, and $R^8$ each represent a C1 to C3 alkyl group or a phenyl group, and each of e, f, and g is an integer satisfying the following relationships: $0 \leq e \leq 3$; $0 \leq f \leq 3$; $0 \leq g \leq 3$; and e+f+g=3,

$$R^9R^{10}Si(OR^{11})_h(OR^{12})_i, \quad (C)$$

wherein $R^9$ and $R^{10}$ each represent a hydrogen atom or a C1 to C4 alkyl group, $R^{11}$ and $R^{12}$ each represent a C1 to C3 alkyl group or a phenyl group, and each of h and i is an integer satisfying the following relationships: $0 \leq h \leq 2$; $0 \leq i \leq 2$; and h+i=2.

The compound (A) may include, for example, tetraalkoxy silane such as tetramethoxy silane, tetraethoxy silane, tetrapropoxy silane, tetrabutoxy silane, tetraphenyloxy silane, trimethoxymonoethoxy silane, dimethoxydiethoxy silane, triethoxymonomethoxy silane, trimethoxymonopropoxy silane, monomethoxytributoxy silane, monomethoxytriphenyloxy silane, dimethoxydipropoxy silane, tripropoxymonomethoxy silane, trimethoxymonobutoxy silane, dimethoxydibutoxy silane, triethoxymonopropoxy silane, diethoxydipropoxy silane, tributoxymonopropoxy silane, dimethoxymonoethoxymonobutoxy silane, diethoxymonomethoxymonobutoxy silane, diethoxymonopropoxymonobutoxy silane, dipropoxymonomethoxymonoethoxy silane, dipropoxymonomethoxymonobutoxy silane, dipropoxymonoethoxymonobutoxy silane, dibutoxymonomethoxymonoethoxy silane, dibutoxymonoethoxymonopropoxy silane, and monomethoxymonoethoxypropoxymonobutoxy silane, or oligomers thereof, among which tetramethoxy silane, tetraethoxy silane or oligomers thereof are preferable.

The compound (B) may include, for example, trimethoxy silane, triethoxy silane, tripropoxy silane, triphenyloxy silane, dimethoxymonoethoxy silane, diethoxymonomethoxy silane, dipropoxymonomethoxy silane, dipropoxymonoethoxy silane, diphenyloxylmonomethoxy silane, diphenyloxymonoethoxy silane, diphenyloxymonopropoxy silane, methoxyethoxypropoxy silane, monopropoxydimethoxy silane, monopropoxydiethoxy silane, monobutoxydimethoxy silane, monophenyloxydiethoxy silane, methyltrimethoxy silane, methyltriethoxy silane, methyltripropoxy silane, ethyltrimethoxy silane, ethyltripropoxy silane, ethyltriphenyloxy silane, propyltrimethoxy silane, propyltriethoxy silane, propyltriphenyloxy silane, butyltrimethoxy silane, butyltriethoxy silane, butyltripropoxy silane, butyltriphenyloxy silane, methylmonomethoxydiethoxy silane, ethylmonomethoxydiethoxy silane, propylmonomethoxydiethoxy silane, butylmonomethoxydiethoxy silane, methylmonomethoxydipropoxy silane, methylmonomethoxydiphenyloxy silane, ethylmonomethoxydipropoxy silane, ethylmonomethoxydiphenyloxy silane, propylmonomethoxydipropoxy silane, propylmonomethoxydiphenyloxy silane, butylmonomethoxydipropoxy silane, butylmonomethoxydiphenyloxy silane, methylmethoxyethylpropoxy silane, propylmethoxyethoxypropoxy silane, butylmethoxyethoxypropoxy silane, methylmonomethoxymonoethoxymonobutoxy silane, ethylmonomethoxymonoethoxymonobutoxy silane, propylmonomethoxymonoethoxymonobutoxy silane, and butylmonomethoxymonoethoxymonobutoxy silane, among which trimethoxy silane and triethoxy silane are preferable.

The compound (C) may include, for example, dimethoxy silane, diethoxy silane, dipropoxy silane, diphenyloxy silane, methoxyethoxy silane, methoxypropoxy silane, methoxyphenyloxy silane, ethoxypropoxy silane, ethoxyphenyloxy silane, methyldimethoxy silane, methylmethoxyethoxy silane, methyldiethoxy silane, methylmethoxypropoxy silane, methylmethoxyphenyloxy silane, ethyldipropoxy silane, ethylmethoxypropoxy silane, ethyldiphenyloxy silane, propyldimethoxy silane, propylmethoxyethoxy silane, propylethoxypropoxy silane, propyldiethoxy silane, propyldiphenyloxy silane, butyldimethoxy silane, butylmethoxyethoxy silane, butyldiethoxy silane, butylethoxypropoxy silane, butyldipropoxy silane, butylmethylphenyloxy silane, dimethyldimethoxy silane, dimethylmethoxyethoxy silane, dimethyldiethoxy silane, dimethyldiphenyloxy silane, dimethylethoxypropoxy silane, dimethyldipropoxy silane, diethyldimethoxy silane, diethylmethoxypropoxy silane, diethyldiethoxyproxy silane, dipropoxydimethoxy silane, dipropyldiethoxy silane, dipropyldiphenyloxy silane, dibutyldimethoxy silane, dibutyldiethoxy silane, dibutyldipropoxy silane, dibutylmethoxyphenyloxy silane, methylethyldimethoxy silane, methylethyldiethoxy silane, methylethyldipropoxy silane, methylethyldiphenyloxy silane, methylpropyldimethoxy silane, methylpropyldiethoxy silane, methylbutyldimethoxysilane, methylbutyldiethoxy silane, methylbutyldipropoxy silane, methylethylethoxypropoxy silane, ethylpropyldimethoxy silane, ethylpropylmethoxyethoxy silane, dipropyldimethoxy silane, dipropylmethoxyethoxy silane, propylbutyldimethoxy silane, propylbutyldiethoxy silane, dibutylmethoxypropoxy silane, and butylethoxypropoxy silane, among which dimethoxy silane, diethoxy silane and methyldimethoxy silane are preferable.

The etching gas used in the dry etching of the spin-on-glass material as the intermediate layer may be a gas containing as a major constituent a fluorocarbon-based gas.

The etching gas used in the dry etching of the undercoating material of the present invention may be a gas containing as a major constituent an oxygen-based gas.

In the fourth wiring formation method of the present invention, the electroconductive material for the wiring layer is preferably Cu. However, other materials such as a Cu alloy, Al, an Al alloy, etc. may be used in addition to Cu. The embedded wiring layer may be formed by any methods such as electrolytic plating.

The material which may be used in the low-dielectric layer may include low-dielectric materials based on carbon-doped oxide (SiOC), methyl silsesquioxane (MSQ) and hydroxyl silsesquioxane (HSQ). As the low-dielectric layer of the carbon-doped oxide, specifically, there are examples such as Black Diamond (Product Name) by Applied Materials, Inc., Coral (Product Name) by Novellus Systems, Inc., and Aurora (Product Name) by ASM Japan, K.K. As the low-dielectric layer of the methyl silsesquioxane, specifically, there are examples such as commercially available materials with product names of OCD T-9, OCD T-11, OCL T-31, OCL T-37, and OCL T-39, by Tokyo Ohka Kogyo Co., Ltd. Further, As the low-dielectric layer of the hydroxyl silsesquioxane, specifically, there are examples such as commercially available materials with product names of OCD T-12 and OCL T-32 by Tokyo Ohka Kogyo Co., Ltd.

In the fourth wiring formation method of the present invention, the lower-dielectric layer may be formed on the wiring layer or on a barrier film (etching stopper layer: SiN, SiC, SiCN, Ta, TaN, etc.) on the wiring layer. The low-dielectric layer is usually calcinated by hard baking at 350° C. or more.

A photoresist material used generally with i- and g-line from a mercury lamp and KrF excimer laser, ArF excimer laser, $F_2$ excimer laser and electron beam (EB) may be used in accordance with lithographic method to form the photoresist layer.

In the fourth wiring formation method of the present invention, a commercial material which can be removed with a conventionally used $CF_4$-based etching gas or a $N_2+O_2$-based etching gas may be used as the anti reflective coating film arranged as necessary. The anti reflective coating layer can absorb exposure light, to prevent the light from entering the undercoating layer. Commercially available anti reflective coating materials are as follows: SWK-EX1D55, SWK-EX3, SWK-EX4, SWK-T5D60, SWK-T7 and the like, by Tokyo Ohka Kogyo Co., Ltd.; DUV-42, DUV-44, ARC-28, ARC-29, and the like by Brewer Science; and AR-3, AR-19, and the like by Shipley Company, L.L.C.

When the anti reflective coating film is used, the second etching space is formed, then the embedded material in the first etching space is removed, and the photoresist layer and the anti reflective coating film are removed, as described above.

The anti reflective coating film is usually removed with oxygen plasma ashing treatment. However, oxygen plasma ashing treatment may cause damage to the low-dielectric layer and is thus not preferable. In the present invention, therefore, the treatment for removing the anti reflective coating film is preferably realized by removing the embedded material layer below the remaining anti reflective coating layer thereby lifting the film off.

Particularly when a hydroxysyl silsesquioxane-based material is used as the low-dielectric layer, the surface of the low-dielectric layer is modified by irradiation with plasma generated from an inert gas such as He, Ar or the like. By the surface modification, the remaining anti reflective coating film and the photoresist pattern can be removed by treatment with oxygen plasma without damage to the low-dielectric layer.

Examples of the present invention are described below. However, the Examples are only illustrative in order to describe the present invention suitably, and by no means limiting the invention.

The following Examples 1 to 5 and the Comparative Example 1 relate to the first undercoating material and the first wiring formation method of the present invention.

EXAMPLES 1 TO 4

The following resin compositions (A), (B), (C), and (D) were prepared as the undercoating materials.

(A) A resin composition with a solid content adjusted to 6 wt %, produced by dissolving a resin component consisting of ethyl p-styrenesulfonate in a solvent consisting of γ-butyrolactone/ethyl lactate (2:8).

(B) A resin composition with a solid content adjusted to 6 wt %, produced by dissolving a resin component consisting of ethyl p-styrenesulfonate:hydroxyethyl acrylate (5:5), and Cymel 1172 (tetramethylol glycoluril by Mitsui Cyanamid Corporation) in an amount of 20 wt % based on the resin component, in a solvent consisting of ethyl lactate.

(C) A resin composition with a solid content adjusted to 6 wt %, produced by dissolving a resin component consisting of ethyl p-styrenesulfonate/9-hydroxyanthracenyl acrylate (5:5), in a solvent consisting of γ-butyrolactone/ethyl lactate (2:8).

(D) A resin composition with a solid content adjusted to 6 wt %, produced by dissolving a resin component consisting of ethyl p-styrenesulfonate/hydroxyethyl acrylate/9-hydroxyanthracenyl acrylate (4:3:3), Cymel 1172 (tetramethylol glycoluril by Mitsui Cyanamid Corporation) in an amount of 20 wt % based on the resin component, and Megafack R08 (fluorine type surfactant by Dainippon Ink and Chemicals, Incorporated) in an amount of 1000 parts per million based on the solid content of the former two, in a solvent consisting of ethyl lactate.

Each of the resin compositions (A), (B), (C), and (D) was applied onto a semiconductor substrate and heat-treated at 200° C. for 90 seconds to form an undercoating layer of 2000 angstroms in thickness.

TDUR-P630 (photoresist composition by Tokyo Ohka Kogyo Co., Ltd.) was applied onto the undercoating layer and heat-treated at 120° C. for 90 seconds to form a photoresist layer of 5000 angstroms in thickness. The photoresist layer was exposed to light and subjected to post-light-exposure heating (110° C., 90 seconds) and then to development treatment to form a 250 nanometer photoresist pattern.

An exposed portion of the undercoating layer which was not covered with the photoresist pattern thus obtained was removed by drying etching with a fluorocarbon-based etching gas. Using as the mask the photoresist pattern and the undercoating layer patterned in the same manner as the photoresist pattern layer, the substrate dielectric layer thereebeneath was etched, to form a wiring structure such as a trench or a via hole.

After the wiring structure was formed as described above, the substrate was dipped in a stripping solution consisting of a mixed solvent of dimethyl sulfoxide and monoethanolamine (mixing ratio=7:3) at 100° C. for 20 minutes to remove the photoresist pattern and the undercoating layer.

By observing the surface of each substrate after the stripping treatment of the undercoating layer under a scanning microscope, the resolution of each wiring structure pattern was evaluated. As a result, it was confirmed that a rectangular pattern with a good sectional shape excellent in dimensional regulation was obtained when any one of the undercoating materials (A), (B), (C), and (D) was used.

EXAMPLE 5

The resin composition (C) was additionally blended with an optical acid-generating agent TPS-109 (Midori Kagaku Corporation) in an amount of 3 wt % based on the resin component to prepare a new resin composition (C2). A wiring structure was formed in the same manner as in Example 1 except that the resin composition (C2) was used. As a result, a wiring structure having a rectangular pattern excellent in dimensional regulation was obtained.

COMPARATIVE EXAMPLE 1

An undercoating material (Product Name SWK-EX 3 by Tokyo Ohka Kogyo Co., Ltd.) containing as major ingredients a crosslinking agent and a light-absorbing component was applied onto a semiconductor substrate and heat-treated at 200° C. for 90 seconds to form an undercoating layer of 2000 angstroms in thickness. A chemically amplifiable photoresist composition (Product Name TDUR-P630 by Tokyo Ohka Kogyo Co., Ltd.) was applied onto the undercoating layer and heat-treated at 120° C. for 90 seconds to form a photoresist layer of 5000 angstroms in thickness. The resulting photoresist layer was exposed to light and subjected to post-light-exposure heating (110° C., 90 seconds) and then to development treatment to form a 250 nanometer photoresist pattern.

An exposed portion of the undercoating layer which is not covered with the photoresist pattern thus obtained was removed by drying etching with a fluorocarbon-based etching gas. Using as the mask the photoresist pattern and the undercoating layer patterned in the same manner as the photoresist pattern layer, the substrate dielectric layer thereebeneath was etched, to form a wiring structure such as a trench or a via hole.

After the wiring structure was formed as described above, the photoresist pattern and the undercoating layer remaining on the substrate were removed with $O_2$ plasma ashing.

By observing the surface of each substrate under a scanning microscope after the stripping treatment of the undercoating layer by ashing, the resolution of each wiring structure pattern was evaluated. As a result, the surface of the dielectric layer having the wiring structure formed thereon had been corroded, and it was estimated that the degree of corrosion was in such a degree as to hinder device characteristics upon formation of the wiring layer.

Separately, the substrate just after formation of the wiring structure was dipped in the stripping solution used in the above Examples, but the remaining undercoating layer could not be removed.

The following Examples 6 to 10 and Comparative Examples 2 to 4 relate to the second undercoating material and the wiring formation method according to the present invention.

EXAMPLES 6 TO 9

The following resin compositions (A), (B), (C), and (D) were prepared as the undercoating materials.

(A) A resin composition with a solid content adjusted to 6 wt %, produced by dissolving a resin component consisting of ethyl p-styrenesulfonate in a solvent consisting of γ-butyrolactone/ethyl lactate (2:8).

(B) A resin composition with a solid content adjusted to 6 wt %, produced by dissolving a resin component consisting of ethyl p-styrenesulfonate:hydroxyethyl acrylate (5:5), and Cymel 1172 (tetramethylol glycoluril by Mitsui Cyanamid Corporation) in an amount of 20 wt % based on the resin component, in a solvent consisting of ethyl lactate.

(C) A resin composition with a solid content adjusted to 6 wt %, produced by dissolving a resin component consisting of ethyl p-styrenesulfonate:9-hydroxyanthracenyl acrylate (5:5), in a solvent consisting of γ-butyrolactone/ethyl lactate (2:8).

(D) A resin composition with a solid content adjusted to 6 wt %, produced by dissolving a resin component consisting of ethyl p-styrenesulfonate:hydroxyethyl acrylate:9-hydroxyanthracenyl acrylate (4:3:3), Cymel 1172 (tetramethylol glycoluril by Mitsui Cyanamid Corporation) in an amount of 20 wt % based on the resin component, and Megafack R08 (fluorine type surfactant by Dainippon Ink and Chemicals, Incorporated) in an amount of 1000 parts per million based on the solid content of the former two, in a solvent consisting of ethyl lactate.

Each of the resin composition (A), (B), (C), and (D) was applied onto a semiconductor substrate and heat-treated at 200° C. for 90 seconds to form an undercoating layer of 3000 angstroms in thickness.

A silicon-containing resist composition was applied onto the undercoating layer and heat-treated at 100° C. for 90 seconds to form an upper resist layer of 1500 angstroms in thickness. The upper resist layer was exposed to light and then subjected to development treatment to form an upper resist pattern.

An exposed portion of the undercoating layer which was not covered with the upper resist pattern thus obtained was removed by drying etching with a fluorocarbon-based etching gas to give an undercoating pattern. Using as the mask the upper resist pattern and the lower resist pattern, the substrate dielectric layer therebeneath was etched, to form a wiring structure such as a trench or a via hole.

After the wiring structure was formed as described above, the substrate was dipped in a stripping solution consisting of a mixed solvent of dimethyl sulfoxide and monoethanolamine (mixing ratio=7:3) at 100° C. for 20 minutes to remove the upper resist pattern and the lower resist pattern.

By observing the surface of each substrate under a scanning microscope after the stripping treatment of the undercoating layer, the state of the surface of each substrate was evaluated. As a result, the undercoating layer and the upper resist layer were not observed to remain when any one of the undercoating materials (A), (B), (C), and (D) was used, and sufficient removal was confirmed.

EXAMPLE 10

Each of the resin composition (A), (B), (C), and (D) was applied onto a semiconductor substrate and heat-treated at 200° C. for 90 seconds to form an undercoating layer of 3000 angstroms in thickness.

A silicon-containing resist composition was applied onto the undercoating layer and heat-treated at 100° C. for 90 seconds to form an upper resist layer of 150 angstroms in thickness. The upper resist layer was exposed to light and subjected to development treatment to form an upper resist pattern.

An exposed portion of the undercoating layer which was not covered with the upper resist pattern thus obtained was removed by drying etching with a fluorocarbon-based etching gas to give a lower resist pattern.

The substrate at this stage was dipped in a stripping solution consisting of a mixed solvent of dimethyl sulfoxide and monoethanolamine (mixing ratio=7:3) at 100° C. for 20 minutes to remove the upper resist pattern and the lower resist pattern.

By observing the surface of each substrate after the stripping treatment of the undercoating layer under a scanning microscope, the state of the surface of each substrate was evaluated. As a result, the undercoating layer and the upper resist layer were not observed to remain when any one of the undercoating materials (A), (B), (C), and (D) was used, and it was confirmed that the rework treatment of the substrate was reliably conducted.

COMPARATIVE EXAMPLE 2

A wiring structure was formed on a semiconductor substrate in the same manner as in Examples 1 to 4 except that the undercoating layer was formed using a composition having hexamethoxy methylated melamine dissolved in propylene glycol monomethyl ether acetate.

After the wiring structure was formed in the manner as described above, the substrate was dipped in a stripping solution consisting of a mixed solvent (mixing ratio=7:3) of dimethyl sulfoxide and monoethanolamine at 100° C. for 20 minutes. However, the upper resist pattern and the lower resist pattern could not be removed.

COMPARATIVE EXAMPLE 3

An upper resist pattern and a lower resist pattern were formed in the same manner as in Example 10 except that the undercoating layer was formed using a composition having hexamethoxy methylated melamine dissolved in propylene glycol monomethyl ether acetate.

The substrate at this stage was dipped in a stripping solution consisting of a mixed solvent (mixing ratio=7:3) of dimethyl sulfoxide and monoethanolamine at 100° C. for 20 minutes. However, the upper resist pattern and the lower resist pattern could not be removed.

COMPARATIVE EXAMPLE 4

In Comparative Examples 2 and 3, the removal treatment with the resist stripping solution was replaced by removal treatment with $O_2$ plasma ashing. When the surface of each substrate after the treatment was observed, the upper resist pattern consisting of the silicon-containing resist composition had been modified as a remaining film. For the purpose of removing the remaining material, the substrate was dipped in an alkaline stripping solution, but the remaining material could not be removed.

The following Examples 11 to 15 and Comparative Examples 5 and 6 relate to the third undercoating material and the wiring formation method according to the present invention.

EXAMPLES 11 TO 14

The following resin compositions (A), (B), (C), and (D) were prepared as the undercoating materials.

(A) A resin composition with a solid content adjusted to 6 wt %, produced by dissolving a resin component consisting of ethyl p-styrenesulfonate in a solvent consisting of γ-butyrolactone/ethyl lactate (2:8).

(B) A resin composition with a solid content adjusted to 6 wt %, produced by dissolving a resin component consisting of ethyl p-styrenesulfonate:hydroxyethyl acrylate (5:5), and Cymel 1172 (tetramethylol glycoluril by Mitsui Cyanamid Corporation) in an amount of 20 wt % based on the resin component, in a solvent consisting of ethyl lactate.

(C) A resin composition with a solid content adjusted to 6 wt %, produced by dissolving a resin component consisting of ethyl p-styrenesulfonate:9-hydroxyanthracenyl acrylate (5:5), in a solvent consisting of γ-butyrolactone/ethyl lactate (2:8).

(D) A resin composition with a solid content adjusted to 6 wt %, produced by dissolving a resin component consisting of ethyl p-styrenesulfonate:hydroxyethyl acrylate:9-hydroxyanthracenyl acrylate (4:3:3), Cymel 1172 (tetramethylol glycoluril by Mitsui Cyanamid Corporation) in an amount of 20 wt % based on the resin component, and Megafack R08 (fluorine type surfactant by Dainippon Ink and Chemicals, Incorporated) in an amount of 1000 parts per million based on the solid content of the former two, in a solvent consisting of ethyl lactate.

Figure 10A:
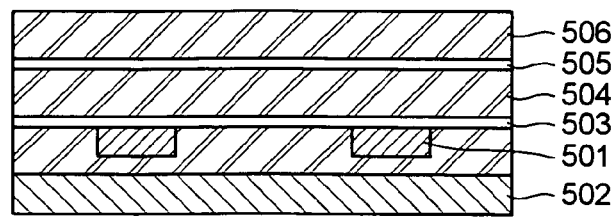
FIG. 10 explains an example of the third wiring formation method using the undercoating material for multilayer process according to the present invention (the third undercoating material) applied to the formation of the dual damascene structure, wherein 10A to 10E are formation diagrams of a dual damascene structure.

Referring to FIG. 10A, on a substrate 502 having a copper wiring layer 501 formed thereon were formed a first barrier layer 503 made of a SiN layer as a first layer, a first low-dielectric layer 504 made of a low-dielectric material (Product Name OCD-T12 by Tokyo Ohka Kogyo Co., Ltd.) as a second layer, a second barrier layer 505 made of a SiN layer as a third layer, and a second low-dielectric layer 506 made of a low-dielectric material (Product Name OCD-T12 by Tokyo Ohka Kogyo Co., Ltd.) as a fourth layer.

Figure 10B:
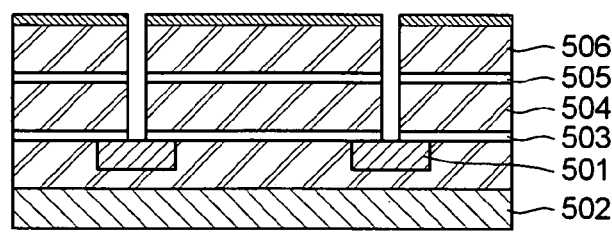

As illustrated in FIG. 10B, a photoresist layer 507 was then formed on the second low-dielectric layer 506. The photoresist layer 507 was processed by lithography to give a resist pattern 508. Using the resulting resist pattern 508 as the mask, a via hole 509 penetrating the first to the fourth layers and reaching the copper wiring layer 501 was formed. After the via hole 509 was formed, the resist pattern 508 was removed.

Figure 10C:
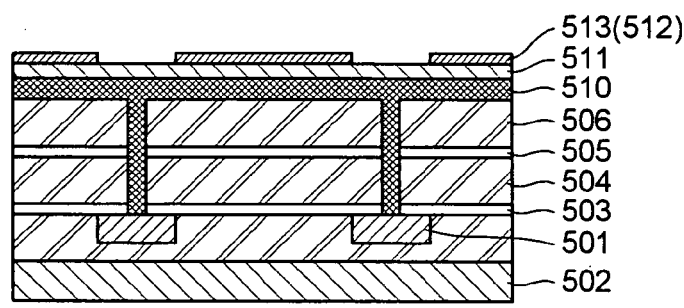
Figure 10D:
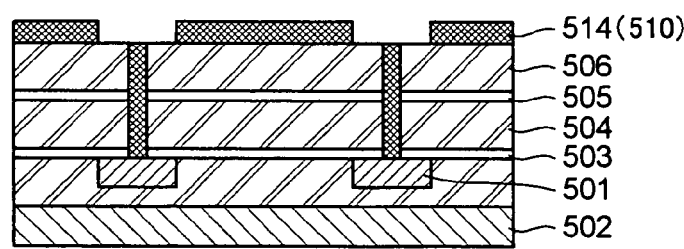

As illustrated in FIG. 10C, after the via hole 509 was formed and the resist pattern 508 was removed, the above-mentioned resin composition (A), (B), (C), or (D) was applied onto the second dielectric layer 506 and simultaneously charged in the via hole and then heat-treated at 200° C. for 90 seconds to form an undercoating layer 510 of 3000 angstroms in thickness on the second lower dielectric layer. A resin composition containing as a major constituent a spin-on-glass material was applied onto the undercoating layer 510 to form an intermediate layer 511 of 150 angstroms in thickness. A photoresist composition (Product Name TArF-P6071 by Tokyo Ohka Kogyo Co., Ltd.) was applied onto the intermediate layer 511 and heat-treated at 120° C. for 90 seconds to form an upper layer 512 of 400 nanometers in thickness. The upper layer 512 was then exposed to light and subjected to post-light-exposure heating (120° C., 90 seconds) and then to development treatment to form a trench-forming upper resist pattern 513.

The intermediate layer 511 was processed with a fluorocarbon-based etching gas using the upper resist pattern 513 as the mask to give an intermediate layer pattern. As illustrated in 10D, the undercoating layer 510 was then processed with an oxygen-based etching gas using the intermediate layer pattern as the mask to form an undercoating layer pattern 514. The intermediate layer resist pattern was removed, whereby a final resist pattern for forming a trench was obtained. When the surface of the substrate was observed under a scanning electron microscope, there was no pattern defect caused by the adverse influence of poisoning, and no damage to the low-dielectric layer constituting a trench was observed.

Figure 10E:
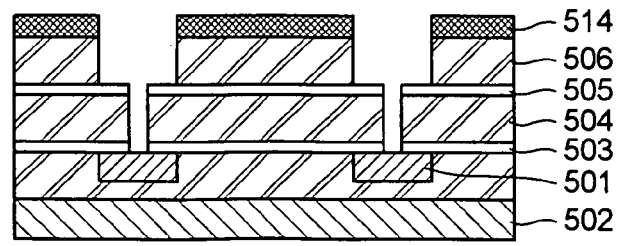

In a conventional wiring layer formation process, the second lower-dielectric layer 506 is etched using the final resist pattern (lower resist pattern) as the mask, to form a trench 515 in a predetermined pattern having a depth reaching the second barrier layer 505, as illustrated in FIG. 10E. Thereafter, copper is embedded in the via hole 509 and a trench 515, whereby a multilayer wiring structure is formed.

Assuming that generation of patterning defects was found upon formation of the final resist pattern 514, a process for removing the resist pattern for rework was carried out in the following manner.

The stripping treatment of the resist pattern was carried out by dipping the substrate having the lower resist pattern 514 in a photoresist stripping solution consisting of a mixed solvent of dimethyl sulfoxide/monoethanolamine (mixing ratio=7:3) at 100° C. for 510 minutes. After the stripping treatment, the surface of the substrate was observed under a scanning microscope, and as a result, it was confirmed that no remaining resist pattern was present when any one of the undercoating materials (A), (B), (C), and (D) was used, confirming the reliable stripping and removal of the resist pattern. No damage to the low-dielectric layer 506 by the stripping treatment of the resist pattern was observed.

EXAMPLE 15

The resin composition (C) was additionally blended with an optical acid-generating agent TPS-109 (Midori Kagaku Corporation) in an amount of 3 wt % based on the resin component to prepare a new resin composition (C2). A resist pattern was formed in the same manner as in Example 1 except that the resin composition (C2) was used. As a result, a resist pattern having a rectangular resist pattern excellent in dimensional regulation was obtained, and it was confirmed that the influence of poisoning from the low-dielectric layer was prevented by the undercoating material of the present invention. Further, the surface of the low-dielectric layer after the stripping treatment of the resist patter was observed under a scanning microscope, and as a result, it was confirmed that no remaining resist pattern was present on the surface of the substrate after stripping treatment, indicating sufficient removal. Further, there was no damage to the low-dielectric layer.

COMPARATIVE EXAMPLE 5

Formation of a resist pattern, stripping and removal thereof were carried out in the same manner as in the above examples except that the undercoating material was constituted from a resin composition including hexamethoxy methylated melamine dissolved in propylene glycol monomethyl ether acetate, and the undercoating layer pattern was removed by $O_2$ plasma ashing treatment. As a result, poisoning occurred in the trench-forming photoresist pattern so that there was a region where a pattern image could not be formed. Further, severe damage to the low-dielectric layer was generated upon the stripping treatment of the pattern by $O_2$ plasma ashing.

COMPARATIVE EXAMPLE 6

In Comparative Example 5, the removal of the undercoating layer pattern was carried out with the photoresist stripping solution used in the above examples. As a result, the pattern could not be removed.

The following Examples 16 to 21 and Comparative Examples 7 and 8 relate to the filler material and the fourth wiring formation method according to the present invention.

EXAMPLES 16 TO 19

The following resin compositions (A), (B), (C), and (D) were prepared as the filler materials.

(A) A resin composition with a solid content adjusted to 6 wt %, produced by dissolving a resin component consisting of ethyl p-styrenesulfonate in a solvent consisting of γ-butyrolactone/ethyl lactate (2:8).

(B) A resin composition with a solid content adjusted to 6 wt %, produced by dissolving a resin component consisting of ethyl p-styrenesulfonate:hydroxyethyl acrylate (5:5), and Cymel 1172 (tetramethylol glycoluril by Mitsui Cyanamid Corporation) in an amount of 20 wt % based on the resin component, in a solvent consisting of ethyl lactate.

(C) A resin composition with a solid content adjusted to 6 wt %, produced by dissolving a resin component consisting of ethyl p-styrenesulfonate/9-hydroxyanthracenyl acrylate (5:5), in a solvent consisting of γ-butyrolactone/ethyl lactate (2:8).

(D) A resin composition with a solid content adjusted to 6 wt %, produced by dissolving a resin component consisting of ethyl p-styrenesulfonate/hydroxyethyl acrylate/9-hydroxyanthracenyl acrylate (4:3:3), Cymel 1172 (tetramethylol glycoluril by Mitsui Cyanamid Corporation) in an amount of 20 wt % based on the resin component, and Megafack R08 (fluorine type surfactant by Dainippon Ink and Chemicals, Incorporated) in an amount of 1000 parts per million based on the solid content of the former two, in a solvent consisting of ethyl lactate.

Separately, a substrate having a Cu layer formed thereon was provided thereon with an interlaminar insulating layer consisting of a barrier layer consisting of a SiN layer as a first layer, a low-dielectric layer (Product Name OCD-T12 by Tokyo Ohka Kogyo Co., Ltd.) as a second layer, a barrier layer consisting of SiN as a third layer, and a low-dielectric layer (Product Name OCD-T12 by Tokyo Ohka Kogyo Co., Ltd.) as a fourth layer in this order. A photoresist composition (Product Name TDUR-P630 by Tokyo Ohka Kogyo Co., Ltd.) was applied onto the interlaminar insulating layer and heat-treated at 120° C. for 90 seconds to form a photoresist layer of 5000 angstroms in thickness. The photoresist layer was exposed to light and subjected to post-light-exposure heating (110° C., 90 seconds) and then to development treatment to form a 250 nanometer photoresist pattern. The interlaminar insulating layer was etched with the photoresist pattern as the mask to form a via hole reaching the Cu layer.

One of the resin compositions (A) to (D) was applied onto the interlaminar insulating layer after removal of the photoresist pattern thereby forming a embedded material layer on the interlaminar insulating layer and simultaneously charging the embedded material in the via hole. Thereafter, the resin composition was calcinated by heating at 200° C. for 90 seconds.

A photoresist composition (Product Name TDUR-P630 by Tokyo Ohka Kogyo Co., Ltd.) was applied onto the embedded material layer and heat-treated at 90° C. for 90 seconds to form a photoresist layer of 4000 angstroms in thickness. The photoresist layer was exposed to light and subjected post-light-exposure heating (110° C., 90 seconds) and then to development treatment to form a trench-forming photoresist pattern.

The shape of the trench-forming photoresist pattern was observed under a scanning electron microscope. As a result, there was no pattern defect attributable the adverse influence of poisoning, in any case of using the filler materials (A) to (D).

The embedded material layer remaining on the substrate was stripped and removed by dipping it in a stripping solution consisting of a mixed solvent of dimethyl sulfoxide and monoethanolamine (mixing ratio=7:3) at 100° C. for 20 minutes.

Whether there was a remaining material on the substrate was confirmed under a scanning microscope, and as a result, no remaining material on the substrate was recognized when any one of the filler materials (A) to (D) was used, and no damage to the low-dielectric layer was confirmed.

EXAMPLE 20

A dual damascene structure was formed in the same manner as Example 18 except that the filler material or the resin composition (C) was blended with an optical acid-generating agent TPS-109 (Midori Kagaku Corporation) in an amount of 3 wt % based on the resin component. The resulting trench-forming photoresist pattern had no pattern defects resulting from the adverse influence of poisoning. After stripping treatment, no remaining material on the substrate was recognized.

EXAMPLE 21

A dual damascene structure was formed in the same conditions as in Example 18 using the resin composition (C) except that an anti reflective coating film (Product Name SWK-9L by Tokyo Ohka Kogyo Co., Ltd.) was formed as an intermediate layer for the photoresist layer. The resulting trench-forming photoresist pattern had no pattern defects resulting from the adverse influence of poisoning. After stripping treatment, no remaining material on the substrate was recognized.

COMPARATIVE EXAMPLE 7

A dual damascene structure was formed in the same manner as in the above examples except that the filler material was constituted from a resin composition including hexamethoxy methylated melamine dissolved in propylene glycol monomethyl ether acetate, and after use, the removal of the embedded material layer and the removal of the embedded material in the second etching space were conducted with $O_2$ plasma ashing treatment. As a result, poisoning occurred in the trench-forming photoresist pattern so that there was a region where a pattern image could not be formed.

COMPARATIVE EXAMPLE 8

A dual damascene structure was formed in the same manner as in the above example except that a spin-on-glass material (Product Name OCD-T12 by Tokyo Ohka Kogyo Co., Ltd.) was used as the filler material, and after use, the removal of the embedded material layer and the removal of the embedded material in the second etching space were conducted with 0.01 wt % aqueous buffered fluoric acid solution. As a result, poisoning occurred in the trench-forming photoresist pattern so that there was a region where a pattern image could not be formed.

What is claimed is:

1. An undercoating material for lithography, said material being for forming an undercoating layer on a semiconductor substrate before formation of a photoresist layer for forming photoresist pattern on the substrate, said material comprising:

a resin component which has at least a repeating unit represented by the following formula (1):

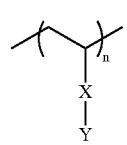

(1)

wherein n is an integer of 1 or more, X represents a C1 to C10 linear or branched alkyl chain, an aromatic or alicyclic alkyl chain or an alkyl ester chain, and Y is a substituent group which is capable of forming a sulfonic acid residue after application of a predetermined energy.

2. An undercoating material for silicon bilayer process, said material being for forming an undercoating layer of a lithographic silicon bilayer process for accurately forming a wiring layer on a substrate, said material comprising:

a resin component which has at least a repeating unit represented by the following formula (1):

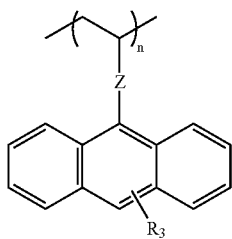
(2)

wherein n is an integer of 1 or more, X represents a C1 to C10 linear or branched alkyl chain, an aromatic or alicyclic alkyl chain or an alkyl ester chain, and Y is a substituent group which is capable of forming a sulfonic acid residue after application of a predetermined energy.

3. The undercoating material for silicon bilayer process according to claim 2, wherein the predetermined energy applied for generating the sulfonic acid residue is light and/or heat.

4. The undercoating material for silicon bilayer process according to claim 2, wherein the substituent group Y in the formula (1) is —$SO_3R_1$ or —$SO_3^-R_2^+$ whereupon $R_1$ and $R_2$ each represent a monovalent organic group.

5. The undercoating material for silicon bilayer process according to claim 4, wherein the organic group $R_1$ is one member selected from the group consisting of a C1 to C10 alkyl group and hydroxyalkyl group.

6. The undercoating material for silicon bilayer process according to claim 4, wherein the organic group $R_2$ is at least one member selected from the group consisting of alkanolamine and alkylamine.

7. The undercoating material for silicon bilayer process according to claim 2, wherein the resin component having at least a substituent group which is capable of releasing the terminal group to form the sulfonic acid residue upon application of predetermined energy is a copolymer of the resin component described in claim 3, and acrylic acid or methacrylic acid or a derivative thereof, or a mixed resin thereof.

8. The undercoating material for silicon bilayer process according to claim 2, wherein the resin component having at least a substituent group which is capable of releasing the terminal group to form the sulfonic acid residue upon application of predetermined energy is a resin component consisting of:

a copolymer produced by copolymerization of the polymer or the mixed resin of the resin component and acrylic acid or methacrylic acid or a derivative thereof, with a repeating unit represented by the following formula (2):

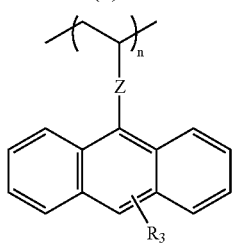
(2)

wherein n is an integer of 1 or more, $R_3$ is at least one member selected from the group consisting of a hydrogen atom, a fluorine atom, a hydroxyl group, a carboxyl group, a C1 to C5 hydroxyalkyl group and a C1 to C5 alkoxyalkyl group, and Z represents a C1 to C10 linear or branched alkyl chain, an aromatic or alicyclic alkyl chain or alkyl ester chain; or a mixed resin of the copolymer or the mixed resin of the resin component described in claim 3 and acrylic acid or methacrylic acid or a derivative thereof, together with a resin compound having the repeating unit represented by formula (2).

9. The undercoating material for silicon bilayer process according to claim 2, which further comprises a crosslinking agent.

10. A wiring formation method comprising:

an undercoating layer forming step of forming an undercoating layer using the undercoating material for silicon bilayer process according to claim 2;

a upper resist pattern forming step of forming an upper photoresist layer using a silicon-containing photoresist material on the undercoating layer and subjecting the upper photoresist layer to exposure and development treatment, to form a predetermined resist pattern;

an undercoating pattern forming step of removing, by dry etching, an exposed portion of the undercoating layer which is not covered with the upper photoresist layer;

a wiring pattern forming step of etching the substrate using the upper resist pattern and the patterned undercoating layer as a mask, to form a predetermined wiring pattern; and a resist pattern removing step of removing, with a resist stripping solution, both the undercoating layer pattern and the upper resist pattern remaining on the substrate at the same time after formation of the wiring pattern.

11. The wiring formation method according to claim 10, wherein the resist stripping solution used in the undercoating resist pattern forming step comprises at least one member selected from the group consisting of a water-soluble amine and quaternary ammonium hydroxide.

12. The wiring formation method according to claim 11, wherein the water-soluble amine is at least one member selected from alkanolamine and alkylamine.

13. An undercoating material for multilayer process, said material being for forming a multilayer having at least an undercoating layer, an intermediate layer and a photoresist upper layer as a final resist pattern for accurately forming a wiring layer on a substrate, said material comprising:

a resin component having at least a substituent group which is capable of releasing a terminal group to form a sulfonic acid group upon application of predetermined energy, and a solvent.

14. The undercoating material for multilayer process according to claim 13, wherein the resin component has at least a repeating unit represented by the following formula (1):

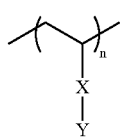
(1)

wherein n is an integer of 1 or more, X represents a C1 to C10 linear or branched alkyl chain, an aromatic or alicyclic alkyl chain or an alkyl ester chain, and Y is a substituent group which is capable of forming a sulfonic acid residue upon application of predetermined energy.

15. The undercoating material for multilayer process according to claim 13, wherein the predetermined energy applied for generating the sulfonic acid residue is heat of not less than 80° C.

16. The undercoating material for multilayer process according to claim 14, wherein the substituent group Y in the formula (1) is —$SO_3R_1$ or —$SO_3^-R_2^+$ whereupon $R_1$ and $R_2$ each represent a monovalent organic group.

17. The undercoating material for multilayer process according to claim 16, wherein the organic group $R_1$ is one member selected from the group consisting of a C1 to C10 alkyl group and hydroxyalkyl group.

18. The undercoating material for multilayer process according to claim 16, wherein the organic group $R_2$ is at least one member selected from the group consisting of alkanolamine and alkylamine.

19. The undercoating material for multilayer process according to claim 13, wherein the resin component having at least a substituent group which is capable of releasing the terminal group to form the sulfonic acid residue upon application of predetermined energy is a copolymer of the resin component described in claim 16 and acrylic acid or methacrylic acid or a derivative thereof, or a mixed resin thereof.

20. The undercoating material for multilayer process according to claim 13, wherein the resin component having at least a substituent group which is capable of releasing the terminal group to form the sulfonic acid residue upon application of predetermined energy is a resin component consisting of:

a copolymer produced by copolymerization of the polymer or the mixed resin of the resin component described in claim 16 and acrylic acid or methacrylic acid or a derivative thereof, with a repeating unit represented by the following formula (2):

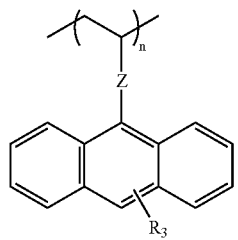

(2)

wherein n is an integer of 1 or more, $R_3$ is at least one member selected from the group consisting of a hydrogen atom, a fluorine atom, a hydroxyl group, a carboxyl group, a C1 to C5 hydroxyalkyl group and a C1 to C5 alkoxyalkyl group, and Z represents a C1 to C10 linear or branched alkyl chain, an aromatic or alicyclic alkyl chain or alkyl ester chain; or a mixed resin of the copolymer or the mixed resin of the resin component described in claim 16 and acrylic acid or methacrylic acid or a derivative thereof, together with a resin compound having the repeating unit represented by the formula (2).

21. The undercoating material for multilayer process according to claim 13, which further comprises a crosslinking agent.

22. A wiring formation method comprising:

an undercoating layer forming step of forming an undercoating layer using the undercoating material for multilayer process according to claim 13 on a substrate;

an intermediate layer forming step of forming an intermediate resist layer using a silicon oxide film material on the undercoating layer;

an upper resist pattern forming step of forming an upper photoresist layer on the intermediate layer and subjecting the upper photoresist layer to exposure and development treatment, to form a predetermined resist pattern;

an intermediate layer pattern forming step of removing, by dry etching, an exposed portion of the intermediate layer which is not covered with the upper resist pattern;

an undercoating layer pattern forming step of removing, by dry etching, an exposed portion of the undercoating layer which is not covered with the intermediate layer pattern as a mask;

a wiring pattern forming step of etching an interlaminar insulating layer on the substrate with the undercoating layer pattern as a mask to form a predetermined wiring pattern; and an undercoating pattern removing step of removing, with a resist stripping solution, the undercoating layer pattern remaining on the substrate after formation of the wiring pattern.

23. The wiring formation method according to claim 22, wherein the resist stripping solution used in the undercoating pattern forming step comprises at least one member selected from the group consisting of a water-soluble amine and quaternary ammonium hydroxide.

24. The wiring formation method according to claim 23, wherein the water-soluble amine is at least one member selected from alkanolamine and alkylamine.

25. The wiring formation method according to claim 22, wherein the silicon oxide film material for forming the intermediate layer makes use of a material obtained by hydrolyzing at least one compound selected from spin-on-glass materials represented by the following formulae:

(A)

wherein $R^1$, $R^2$, $R^3$, and $R^4$ independently represent a C1 to C4 alkyl group or a phenyl group, and each of a, b, c, and d is an integer satisfying the following relationships: $0 \leq a \leq 4$; $0 \leq b \leq 4$; $0 \leq c \leq 4$; $0 \leq d \leq 4$; and a+b+c+d=4,

(B)

wherein $R^5$ represents a hydrogen atom or a C1 to C4 alkyl group, $R^6$, $R^7$, and $R^8$ each represent a C1 to C3 alkyl group or a phenyl group, and each of e, f, and g is an integer satisfying the following relationships: $0 \leq e \leq 3$; $0 \leq f \leq 3$; $0 \leq g \leq 3$; and e+f+g=3,

(C)

wherein $R^9$ and $R^{10}$ each represent a hydrogen atom or a C1 to C4 alkyl group, $R^{11}$ and $R^{12}$ each represent a C1 to C3 alkyl group or a phenyl group, and each of h and i is an integer satisfying the following relationships: $0 \leq h \leq 2$; $0 \leq i \leq 2$; and h+i=2.

26. A filler material for filling an etching space for forming a dual damascene structure composed at least of a first etching space formed in a low-dielectric layer on a substrate and a second etching space communicating with the first etching space and different in shape and dimension to those of the first etching space, said material comprising:

a resin component having at least a substituent group which is capable of releasing a terminal group to form a sulfonic acid residue upon application of predetermined energy, and a solvent.

27. The filler material for forming the dual damascene structure according to claim 26, wherein the resin component has at least a repeating unit represented by the following formula (1):

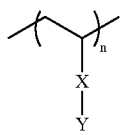

wherein n is an integer of 1 or more, X represents a C1 to C10 linear or branched alkyl chain, an aromatic or alicyclic alkyl chain or an alkyl ester chain, and Y is a substituent group which is capable of forming a sulfonic acid residue upon application of the predetermined energy.

28. The filler material for forming the dual damascene structure according to claim 26, wherein the predetermined energy applied for generating the sulfonic acid residue is heat of not less than 80° C.

29. The filler material for forming the dual damascene structure according to claim 27, wherein the substituent group Y in the formula (1) is $-SO_3R_1$ or $-SO_3^-R_2^+$ whereupon $R_1$ and $R_2$ each represent a monovalent organic group.

30. The filler material for forming the dual damascene structure according to claim 29, wherein the organic group $R_1$ is one member selected from the group consisting of a C1 to $C_{10}$ alkyl group and hydroxyalkyl group.

31. The filler material for forming the dual damascene structure according to claim 29, wherein the organic group $R_2$ is at least one member selected from the group consisting of alkanolamine and alkylamine.

32. The filler material for forming the dual damascene structure according to claim 26, wherein the resin component having at least a substituent group which is capable of releasing the terminal group to form the sulfonic acid residue upon application of predetermined energy is a copolymer of the resin component described in claim 29, and acrylic acid or methacrylic acid or a derivative thereof, or a mixed resin thereof.

33. The filler material for forming the dual damascene structure according to claim 26, wherein the resin component having at least a substituent group which is capable of releasing the terminal group to form the sulfonic acid residue upon application of predetermined energy is a resin component consisting of:
a copolymer produced by copolymerization of the polymer or the mixed resin of the resin component described in claim 29 and acrylic acid or methacrylic acid or a derivative thereof, with a repeating unit represented by the following formula (2):

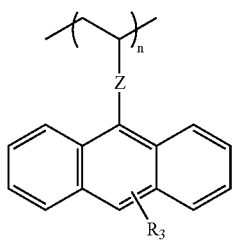

wherein n is an integer of 1 or more, $R_3$ is at least one member selected from the group consisting of a hydrogen atom, a fluorine atom, a hydroxyl group, a carboxyl group, a C1 to C5 hydroxyalkyl group and a C1 to C5 alkoxyalkyl group, and Z represents a C1 to C10 linear or branched alkyl chain, an aromatic or alicyclic alkyl chain or alkyl ester chain; or
a mixed resin of the copolymer or the mixed resin of the resin component described in claim 29 and acrylic acid or methacrylic acid or a derivative thereof, together with a resin compound having the repeating unit represented by formula (2).

34. The filler material for forming the dual damascene structure according to claim 26, which further comprises a crosslinking agent.

35. A method of forming a dual damascene structure, comprising:
an interlaminar insulating layer forming step of laminating an interlaminar insulating layer including at least a low-dielectric layer, on a substrate having a metal layer;
a first etching space forming step of forming a photoresist layer on the interlaminar insulating layer and subjecting the photoresist layer to patterned exposure and development treatment, to form a photoresist pattern, and performing etching using the photoresist pattern as a mask to form a first etching space in the interlaminar insulating layer;
an embedding step of applying the filler material of claim 26 onto the interlaminar insulating layer thereby forming an embedded material layer and simultaneously charging the embedded material into the first etching space,
a photoresist pattern forming step of forming a photoresist layer on the embedded material layer, and subjecting the the photoresist layer to patterned exposure and developing it with a 2.38 wt % tetrametyl ammonium hydroxide developing solution to form a photoresist pattern,
a second etching space forming step of performing etching using the photoresist pattern as a mask to remove the interlaminar insulating layer on the first etching space in a predetermined pattern to form a second etching space communicating with the first etching space; and
an embedded material removing step of removing, with a stripping solution, the embedded material remaining in the second etching space.

36. The method of forming the dual damascene structure according to claim 35, which further comprises a step of forming an anti reflective coating film on the embedded material layer on the interlaminar insulating layer after the embedding step, and a step of processing, by dry etching, an exposed portion of the anti reflective coating film using the photoresist pattern as the mask after the photoresist pattern formation step.

37. The method of forming the dual damascene structure according to claim 35, wherein the stripping solution used in the embedded material removing step comprises at least one member selected from the group consisting of a water-soluble amine and quaternary ammonium hydroxide.

38. The method of forming the dual damascene structure according to claim 37, wherein the water-soluble amine is at least one member selected from alkanolamine and alkylamine.

* * * * *